United States Patent
Otvos et al.

(10) Patent No.: US 8,704,521 B2
(45) Date of Patent: Apr. 22, 2014

(54) NMR ANALYZERS FOR CLINICAL EVALUATION OF BIOSAMPLES

(75) Inventors: James D. Otvos, Apex, NC (US); Elias J. Jeyarajah, Raleigh, NC (US); Stephen Markham, Raleigh, NC (US); Steven P. Matyus, Durham, NC (US); David R. Morgan, Raleigh, NC (US); Bruce D. Silberman, Apex, NC (US); Donald R. Deuel, Raleigh, NC (US)

(73) Assignee: LipoScience, Inc., Raleigh, NC (US)

( * ) Notice: Subject to any disclaimer, the term of this patent is extended or adjusted under 35 U.S.C. 154(b) by 424 days.

(21) Appl. No.: 13/207,594

(22) Filed: Aug. 11, 2011

(65) Prior Publication Data
US 2011/0295517 A1   Dec. 1, 2011

Related U.S. Application Data

(62) Division of application No. 11/093,596, filed on Mar. 30, 2005, now Pat. No. 8,013,602.

(60) Provisional application No. 60/558,516, filed on Apr. 1, 2004.

(51) Int. Cl.
*G01V 3/00* (2006.01)

(52) U.S. Cl.
USPC .......................................... 324/318; 324/309

(58) Field of Classification Search
USPC ........................... 324/322–300; 600/407–445
See application file for complete search history.

(56) References Cited

U.S. PATENT DOCUMENTS

| | | | |
|---|---|---|---|
| 3,910,256 A | 10/1975 | Clark et al. | |
| 4,875,486 A | 10/1989 | Rapoport et al. | |
| 4,933,844 A | 6/1990 | Otvos | |
| 5,343,151 A | 8/1994 | Cory et al. | |
| 5,343,389 A * | 8/1994 | Otvos | 436/173 |
| 5,385,828 A | 1/1995 | Aufenanger | |
| 5,396,886 A * | 3/1995 | Cuypers | 600/301 |
| 5,473,551 A | 12/1995 | Sato et al. | |
| 5,539,316 A | 7/1996 | Sukumar | |
| 5,572,125 A | 11/1996 | Dunkel | |
| 5,685,300 A | 11/1997 | Kuenstner | |
| 5,724,580 A | 3/1998 | Levin et al. | |
| 5,833,601 A | 11/1998 | Swartz et al. | |
| 5,983,734 A | 11/1999 | Mathur et al. | |
| 6,100,687 A | 8/2000 | Weitedamp et al. | |

(Continued)

FOREIGN PATENT DOCUMENTS

| | | |
|---|---|---|
| JP | 56-107151 | 8/1981 |
| JP | 62 043131 | 2/1987 |

(Continued)

OTHER PUBLICATIONS

Bradley, David, Screening with NMR, Modern Drug Discovery, Nov. 2001, pp. 28-30, 32, 34, vol. 4, No. 11.

(Continued)

*Primary Examiner* — Brij Shrivastav
(74) *Attorney, Agent, or Firm* — Myers Bigel Sibley & Sajovec, P.A.

(57) ABSTRACT

The clinical analyzers automatically electronically monitor selected parameters and automatically electronically adjust parameters to maintain the analyzer within desired operational ranges. The clinical NMR analyzers can be configured as a networked system with a plurality of clinical NMR analyzers located at different use sites.

27 Claims, 15 Drawing Sheets

(56) References Cited

U.S. PATENT DOCUMENTS

| | | | |
|---|---|---|---|
| 6,177,798 B1 * | 1/2001 | Haner et al. | 324/321 |
| 6,204,665 B1 | 3/2001 | Triebe et al. | |
| 6,335,166 B1 * | 1/2002 | Ammann et al. | 435/6.11 |
| 6,362,003 B1 | 3/2002 | Young et al. | |
| 6,380,737 B1 | 4/2002 | Myles | |
| 6,396,274 B1 | 5/2002 | Commens et al. | |
| 6,414,491 B1 | 7/2002 | Higgins et al. | |
| 6,452,179 B1 | 9/2002 | Coates et al. | |
| 6,515,260 B1 | 2/2003 | Anderson | |
| 6,576,471 B2 | 6/2003 | Otvos | |
| 6,617,167 B2 | 9/2003 | Otvos et al. | |
| 6,768,304 B2 | 7/2004 | Avizonis et al. | |
| 6,768,305 B1 | 7/2004 | Keifer | |
| 6,838,880 B2 * | 1/2005 | Hofmann et al. | 324/318 |
| 7,270,783 B2 | 9/2007 | Takase et al. | |
| 7,914,442 B1 | 3/2011 | Gazdzinski | |
| 2002/0138208 A1 | 9/2002 | Paulse et al. | |
| 2004/0015449 A1 | 1/2004 | Imai et al. | |
| 2005/0222504 A1 * | 10/2005 | Otvos et al. | 600/410 |
| 2008/0162352 A1 | 7/2008 | Gizewski | |
| 2010/0215573 A1 | 8/2010 | Goetsch et al. | |

FOREIGN PATENT DOCUMENTS

| | | |
|---|---|---|
| JP | 01142444 | 6/1989 |
| JP | 02-236475 | 9/1990 |
| JP | 03018701 | 1/1991 |
| JP | 07-049369 | 2/1995 |
| JP | 11235324 | 2/1998 |
| JP | 2000266829 | 9/2000 |
| JP | 2001124757 | 5/2001 |
| JP | 2001-208819 | 8/2001 |
| JP | 2002257915 | 9/2002 |
| JP | 2003059994 | 2/2003 |
| JP | 2004041489 | 2/2004 |
| WO | WO99/32897 | 1/1999 |
| WO | WO99/67623 | 12/1999 |
| WO | WO01/75467 | 10/2001 |
| WO | WO03/012416 | 2/2003 |

OTHER PUBLICATIONS

Braun, Daniel, et al., Monitoring NMR Spectrometer Performance during Data Accumulation for Macromolecular Structure Determination, Journal of Magnetic Resonance, 1996, Series B 110, pp. 313-315.

European Patent Office Decision of Refusal for corresponding European patent application No. 05733067.2, Aug. 18, 2010, 21 pages.

Grounds of Appeal filed Dec. 17, 2010 with the European Patent Office for corresponding European patent application No. 05733067.2. (Main Request and 8 Auxiliary Requests) 73 pages with associated claim sets.

http://www.gonmr.com, GONMR™, Adiabatics, Inc., 4 sheets, p. 2 of "Features of GONMR™" states Module 1 was completed for first release in Sep. 2003.

http://www.picoweb.net, PICOSERVER® appliance by Lightner Engineering located in San Diego, California, 3 sheets, Copyright © 1999, 2000 Lightner Engineering.

International Search Report and Invitation to Pay Additional Fees, dated Sep. 30, 2005 for corresponding PCT application No. PCT/US05/010875.

International Search Report and Written Opinion, dated Dec. 20, 2005 for corresponding PCT application No. PCT/US05/010875.

Laurent, G., et al., Design and Implementation of a Protection System for NMR Spectrometers, Journal of Magnetic Resonance, 2002, 156, pp. 295-302.

Ross et al., *Automation of NMR measurements and data evaluation for systematically screening interactions of small molecules with target proteins*, Journal of Biomolecular NMR, 16:139-146, 2000.

* cited by examiner

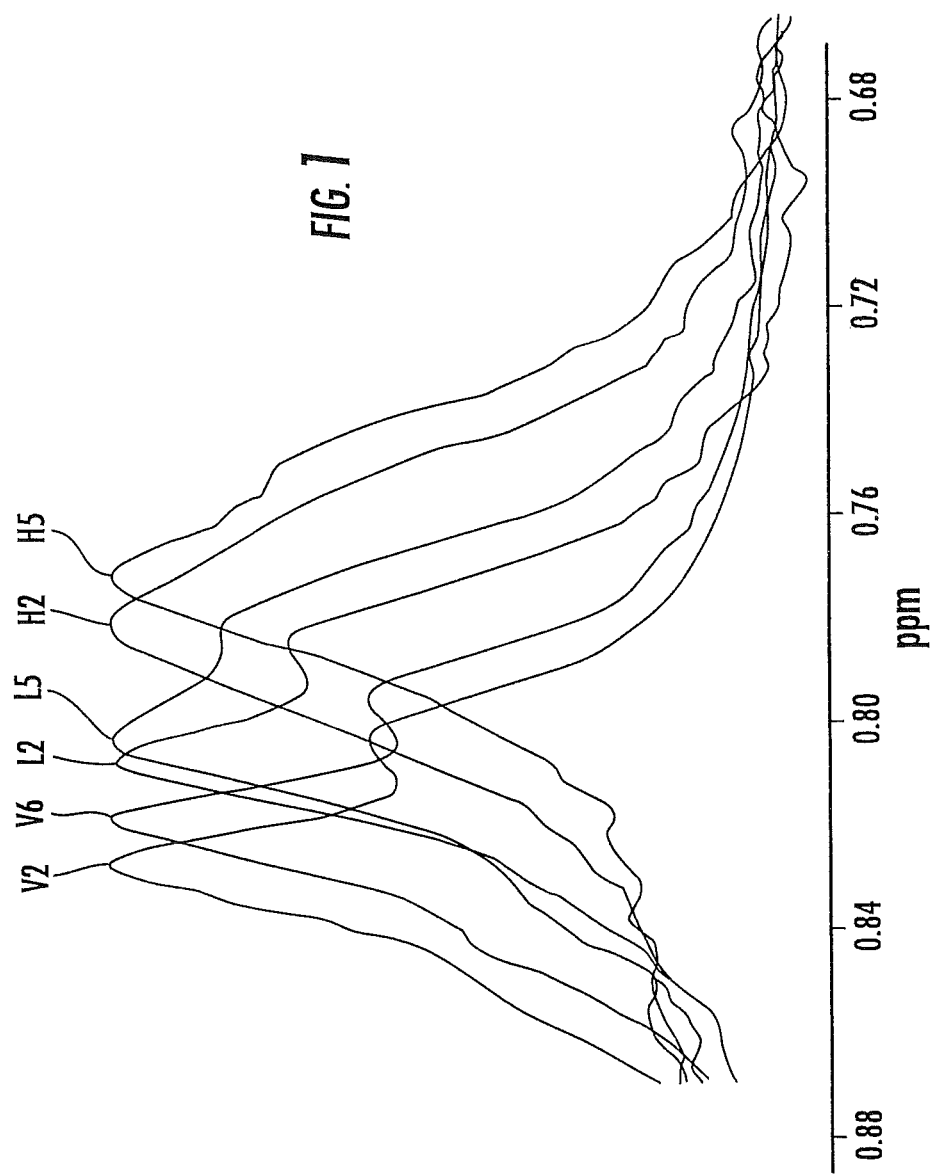

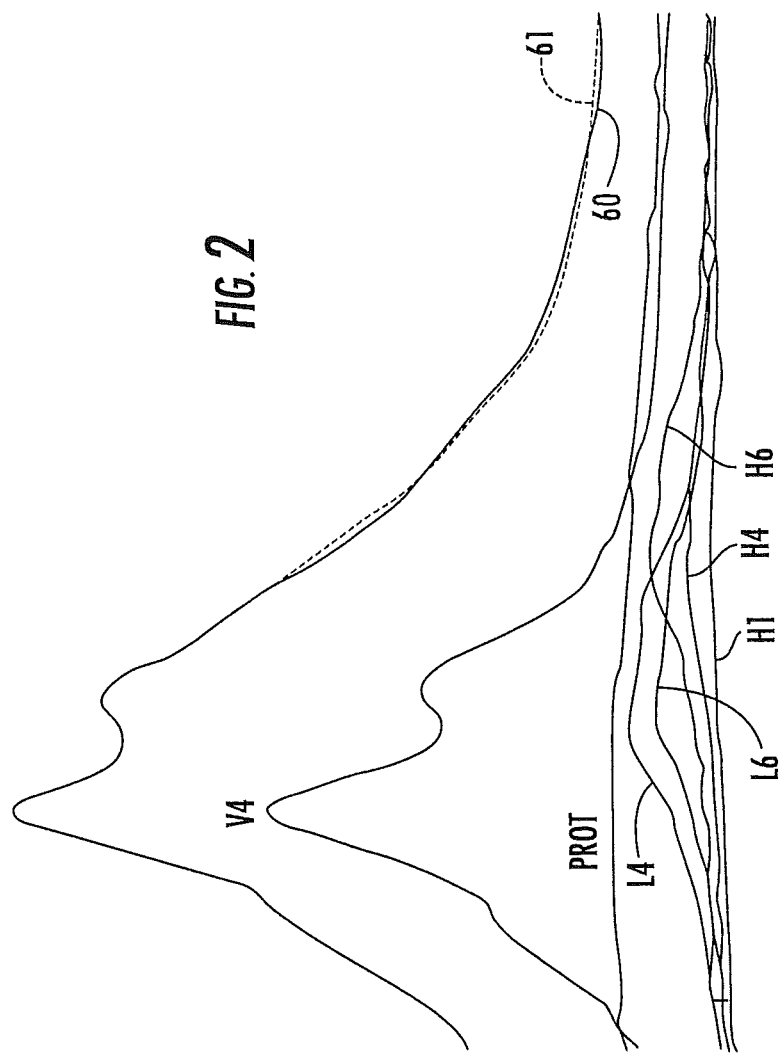

PROCEDURE FOR RUNNING CONTROL SAMPLES

CLINICAL NMR ANALYZER OPERATING PROCEDURE

NMR ANALYZERS FOR CLINICAL EVALUATION OF BIOSAMPLES

RELATED APPLICATIONS

This application is a divisional of U.S. patent application Ser. No. 11/093,596, filed Mar. 30, 2005, now U.S. Pat. No. 8,013,602 which claims the benefit of priority of U.S. Provisional Application Ser. No. 60/558,516, filed Apr. 1, 2004, the contents of which are hereby incorporated by reference as if recited in full herein.

FIELD OF THE INVENTION

The present invention relates generally to NMR systems, and may be particularly suitable for clinical NMR in vitro diagnostic systems capable of analyzing biosamples.

BACKGROUND OF THE INVENTION

In the past, NMR detectors have been used to provide NMR LipoProfile® lipoprotein panel reports. The NMR detectors have been located in a central testing facility with on-site support. The LipoProfile® report, available from LipoScience, Inc., located in Raleigh, N.C., is a lipoprotein test panel that assesses a patient's risk of coronary artery disease ("CAD") and provides NMR-derived (quantitative analysis) lipoprotein measurement average low-density lipoprotein (LDL) particle size as well as LDL particle number, the latter representing the concentration or quantity (in concentration units such as nmol/L), and the former representing the average size of the LDL particles (in nm units) making up the LDL in the sample. HDL and VLDL subclass measurements can also be provided. See www.liposcience.com and U.S. Pat. No. 6,576,471 for exemplary reports of particular lipoprotein subclass parameters; the contents of the patent are hereby incorporated by reference as if recited in full herein.

It is known that NMR spectroscopic evaluation techniques can be used to concurrently obtain and measure a plurality of different lipoprotein constituents in an in vitro blood plasma or serum sample, as described in U.S. Pat. No. 4,933,844, entitled Measurement of Blood Lipoprotein Constituents by Analysis of Data Acquired from an NMR Spectrometer to Otvos and U.S. Pat. No. 5,343,389, entitled Method and Apparatus for Measuring Classes and Subclasses of Lipoproteins, also to Otvos. See also, U.S. Pat. No. 6,617,167, entitled Method Of Determining Presence And Concentration Of Lipoprotein X In Blood Plasma And Serum and co-pending co-assigned U.S. Provisional Patent Application Ser. No. 60/513,795, entitled Methods, Systems and Computer Programs for Assessing CHD Risk Using Mathematical Models that Consider In Vivo Concentration Gradients of LDL Particle Subclasses of Discrete Size. The contents of all the above patents and patent applications are hereby incorporated by reference as if recited in full herein.

As is well known to those of skill in the art, NMR detectors include an RF amplifier, an NMR probe that includes an RF excitation coil (such as a saddle or Helmholtz coil), a cryogenically cooled high-field superconducting magnet and an enclosed flow path that directs samples to flow serially, from the bottom of the magnet bore to a predetermined analysis location in the magnet bore. The NMR detector is typically a high-field magnet housed in a magnetically (and/or RF) shielded housing that can reduce the magnetic field level that is generated to within a relatively small volume. NMR detectors are available from Varian, Inc., having corporate headquarters in Palo Alto, Calif. and Bruker BioSpin, Corp., located in Billerica, Mass.

In operation, to evaluate the lipoproteins in a blood plasma and/or serum sample, the operator places the patient samples in a sample tray and an electronic reader correlates the sample to a patient, typically using a bar code on the sample tray. The sample is aspirated from the sample container and directed to flow through the flow path extending through the NMR detector. For detailed lipoprotein analysis, the NMR detector may analyze the sample for 1-5 minutes to determine amplitudes of a plurality of NMR spectroscopy derived signals within a chemical shift region of the proton NMR spectrum. These signals are derived by deconvolution of the composite signal or spectrum and are compared to predetermined test criteria to evaluate a patient's risk of having or developing coronary artery or heart disease.

In the past, a plurality of NMR spectrometers, all disposed at a central testing facility, have been used to carry out lipoprotein analysis on blood plasma samples to generate LipoProfile® test reports. The NMR spectrometers communicate with a local but remote computer (the computer is in a different room from the spectrometers) to allow the remote computer to obtain NMR spectra and analyze the NMR spectra to generate the patient diagnostic reports with quantitative lipoprotein values. Unfortunately, an operator manually carries out adjustments to the equipment using a manually input quality control sample to adjust the line width. In addition, the sample handler does not communicate with the NMR spectrometer and is not capable of electronically notifying the system of handling problems. The NMR spectrometer systems are complex and typically require dedicated on-site experienced operational oversight.

In view of the above, there remains a need for improved NMR analyzers that may be used in high-volume quantitative clinical applications at one or more remote locations.

SUMMARY OF EMBODIMENTS OF THE INVENTION

Certain embodiments of the present invention are directed at providing automated NMR clinical analyzers that can be used without requiring dedicated on-site NMR support staff and/or undue technician support to reliably operate the NMR analyzers. The automated NMR clinical analyzers can be configured to obtain quantitative analysis measurements that can be used for in vitro diagnostics. In some embodiments, the automated NMR analyzers can be configured to meet governmental medical regulatory requirements such as those described in applicable federal regulations, including those in 21 CFR (such as 21 CFR 820 and 21 CFR 11) for medical devices.

In some embodiments, the NMR analyzers can monitor and adjust selected operating parameters "on the fly" reducing the need for manual assistance and providing automated operation. The NMR analyzers can include interactive sample handlers that communicate with the NMR spectrometer and/or remote control system. The NMR clinical analyzers can be configured to reliably run and obtain quantified clinical measurements for diagnostic tests on high volume throughput of biosamples while reducing the amount of operator input or labor required to operate the automated analyzers. The NMR analyzers can be constructed and/or configured in such a manner as to be able to obtain PMA (pre-market approval) and/or 510(k) approval from the United States Food and Drug Agency ("USFDA") and/or corresponding foreign agencies.

Certain embodiments are directed to methods of operating a clinical NMR in vitro diagnostic analyzer. The methods include: (a) electronically monitoring data associated with selected equipment and/or environmental operational test conditions of a clinical NMR analyzer; (b) electronically determining whether the selected test conditions are within desired operational ranges based on the monitored data; (c) automatically adjusting operational parameters of selected components of the clinical NMR analyzer based on data obtained by the electronically determining step; (d) obtaining NMR signal spectra of a biosample; and (e) analyzing the obtained NMR spectra to generate target clinical measurements of the biosample.

Other embodiments are directed to clinical NMR in vitro diagnostic analyzers. The analyzers include: (a) an automated sample handler configured to automatically introduce biosamples into a magnet bore of a high-field superconducting magnet of a NMR spectroscopy instrument associated with a clinical NMR analyzer; (b) means for automatically obtaining NMR signal spectra of the biosamples; (c) means for automatically electronically sensing data associated with selected operating parameters to verify that test conditions of the NMR diagnostic analyzer are within target operating ranges; and (d) means for automatically electronically adjusting selected operating parameters based on the verified test conditions.

Some embodiments are directed to clinical NMR in vitro diagnostic analyzers that include: (a) an automated sample handler configured to automatically introduce biosamples into a magnet bore of a high-field superconducting magnet of a NMR spectroscopy instrument associated with a clinical NMR analyzer; (b) a control circuit in electronic communication with the NMR spectroscopy instrument; and (c) a plurality of electronic sensors disposed in the clinical NMR analyzer, the electronic sensors in communication with the control circuit, the electronic sensors configured to detect data associated with selected operating parameters to verify that selected conditions of the NMR diagnostic analyzer are within target operating ranges. The clinical NMR analyzer is configured to automatically electronically adjust selected operating parameters based on data provided by the electronic sensors so that the clinical NMR analyzer operates within target process limits.

Still other embodiments are directed to computer program products for automating clinical NMR in vitro diagnostic analyzers. The computer program products include a computer readable storage medium having computer readable program code embodied in said medium. The computer-readable program code includes: (a) computer readable program code configured to automatically run an automated self-diagnostic quality control and/or calibration test for the clinical NMR in vitro diagnostic analyzer; and (b) computer readable program code configured to automatically electronically monitor selected operating parameters of the NMR in vitro diagnostic analyzer over time during operation.

Still other embodiments are directed to methods of analyzing undiluted plasma and/or serum by: (a) obtaining a proton NMR composite spectrum of an undiluted biosample; and (b) generating a spectral deconvolution of the NMR composite spectrum using a predetermined doublet region of the proton NMR spectrum for spectral referencing and/or alignment.

The undiluted biosample may be neat serum and the doublet may comprise a lactate doublet generally centered at about 1.3 ppm of the proton NMR spectrum. The undiluted sample can be serum that comprises glucose and the doublet can be an anomeric proton signal from glucose in the serum that is generally located at about 5.2 ppm of the NMR spectrum.

Another embodiment is directed to computer program products for analyzing undiluted plasma and/or serum. The computer program product includes a computer readable storage medium having computer readable program code embodied in the medium. The computer-readable program code can include: (a) computer readable program code configured to obtain a proton NMR composite spectrum of an undiluted biosample, the proton NMR composite spectrum being devoid of a CaEDTA peak; and (b) computer readable program code configured to generate a spectral deconvolution of the NMR composite spectrum using a predetermined doublet region of the proton NMR spectrum for spectral referencing and/or alignment.

Yet other embodiments are directed to clinical NMR in vitro analyzers that include: (a) an automated sample handler for serially presenting respective biosamples to an input port; (b) an enclosed flow path configured to serially flow the respective biosamples presented by the automated sample handler, wherein the enclosed flow path includes a non-magnetic rigid straight flow cell; (c) an NMR detector in communication with an NMR flow probe, the NMR detector comprising a high-field cryogenically cooled superconducting magnet with a magnet bore, the flow probe configured to generally reside in the magnet bore, wherein the straight flow cell is configured and sized to extend into the magnet bore and direct the samples to serially flow from a top of the magnet bore into the magnet bore during operation; and (d) a processor comprising computer program code for obtaining and analyzing NMR signal spectra of the biosamples to determine desired quantitative measurements of the respective biosamples.

Some embodiments of the present invention are directed to a networked system of clinical NMR analyzers. The system includes: (a) a plurality of clinical NMR analyzers located at different use sites; and (b) at least one remote control (service/support) system in communication with the plurality of clinical NMR analyzers. The at least one remote system is configured to monitor selected local operating parameters associated with each clinical NMR analyzer.

In some embodiments, the remote system monitors the local NMR analyzers to inhibit down time and/or identify and correct process variables before test data is corrupted to increase the reliability of the equipment and quantitative test results. The local and/or remote system can be configured to monitor predetermined process parameter data, service histories, cryogen use, patient test data, and the like.

In some embodiments, the local system can be configured to monitor and identify process variation and generate an alarm that is sent to the remote system (local and/or remote site) for appropriate corrective action/investigation. In other embodiments, the remote system can monitor the process variation and generate an alert to a service/support technician at the remote site. Combinations of the local and remote monitoring can also be used. The remote station can reduce the technical support and/or operator knowledge needed at each local use site thereby allowing increased numbers of clinical analyzers to be used in field sites with relatively economic operational costs.

The local systems may generate and store an electronic history file of selected operational parameters. The electronic history file can be configured to be accessed by the remote system. The local and/or remote system may be configured to automatically monitor process variables and statistically analyze data corresponding to measurements of the monitored process variables to thereby perform an automated quality control analysis (such as maintain the parameters within a 3 sigma and/or in some embodiments, a 6 sigma process limit). In some embodiments, the local system can be configured to automatically adjust operating equipment to keep the process variables within a predetermined statistical variation responsive to the monitored data.

In some embodiments, the clinical NMR analyzers can be configured to automatically adjust scaling of the NMR lineshape when the height and/or width thereof is outside a desired range. The local system can monitor RF excitation pulse power and automatically adjust the RF excitation pulse power if the power is outside a desired operating range and/or varies from pulse to pulse by more than a predetermined amount and/or percentage. In particular embodiments, the clinical NMR analyzers can be configured to disregard NMR signal data obtained when power variation of the RF pulses is greater than a predetermined amount.

Other embodiments are directed to methods of generating NMR-derived quantitative measurement data for diagnostic clinical reports of patient biosamples. The methods include: (a) automatically serially introducing biosamples of interest into an NMR analyzer (which can be carried out by aspirating to an enclosed flow path that serially flows the biosamples into the NMR analyzer) having a NMR spectroscopy instrument with a magnet and a bore at a plurality of different clinical sites; (b) automatically correlating a patient identifier to a respective patient biosample; (c) obtaining NMR derived quantitative measurements of the biosamples for diagnostic reports; and (d) automatically monitoring the NMR analyzers at the different clinical sites from a remote monitoring station.

In some embodiments the methods can include configuring the analyzer/user to decide in situ how to analyze a particular patient biosample. The obtaining step may include determining NMR derived concentration measurements of lipoproteins in an in vitro blood plasma and/or serum sample.

In certain embodiments, the automated clinical NMR analyzer is configured with modular assemblies including: an automated sample handling assembly; an NMR spectrometer; an NMR probe; and a sample flow path to the NMR spectrometer each configured to releasably attach and operate with its mating modular components thereby allowing ease of repair and/or field replacement.

The clinical NMR analyzers may be configured to automatically run an automated self-diagnostic quality control test at startup. The analyzer may include computer program code that is configured to determine a patient's risk of having and/or developing CHD based on the NMR derived quantitative measurements of the patient's respective biosample and/or computer program code that is configured to determine a patient's risk of having and/or developing Type II diabetes based on the NMR derived quantitative measurements of the patient's respective biosample.

Yet additional embodiments are directed to clinical NMR in vitro diagnostic apparatus for obtaining data regarding lipoprotein constituents in a biosample. The apparatus includes: (a) an automated sample handler system comprising a plurality of in vitro blood plasma and/or serum samples; (b) an NMR spectrometer for serially acquiring an NMR composite spectrum of the in vitro blood plasma or serum sample in communication with the automated handler system; (c) at least one sample of validated control material configured to repeatedly controllably flow into and out of the NMR spectrometer at desired times; and (d) a processor configured to receive data of the validated control material. The processor includes: (a) computer program code configured to define an a priori single basis set of spectra of validated reference control material; (b) computer program code configured to obtain NMR spectra of the validated control material; and (c) computer program code configured to perform a spectral deconvolution of a $CH_3$ region of the obtained NMR spectra of the validated control material and comparing data associated with the spectral deconvolution of the $CH_3$ region with data associated with the a priori spectra of the validated control material to determine whether the NMR analyzer is in a suitable operational status and/or ready for diagnostic testing operation.

As will be appreciated by those of skill in the art in light of the present disclosure, embodiments of the present invention may include methods, systems, apparatus and/or computer program products or combinations thereof.

The foregoing and other objects and aspects of the present invention are explained in detail in the specification set forth below.

BRIEF DESCRIPTION OF THE FIGURES

FIG. 1 is a graph showing the chemical shift spectra of a representative sample of lipoprotein constituent subclasses.

FIG. 2 is a graph illustrating NMR spectra for a composite plasma sample and the lipoprotein subclass and protein components thereof, with the peaks for methyl groups being illustrated.

DETAILED DESCRIPTION OF EMBODIMENTS OF THE INVENTION

Figure 3A:
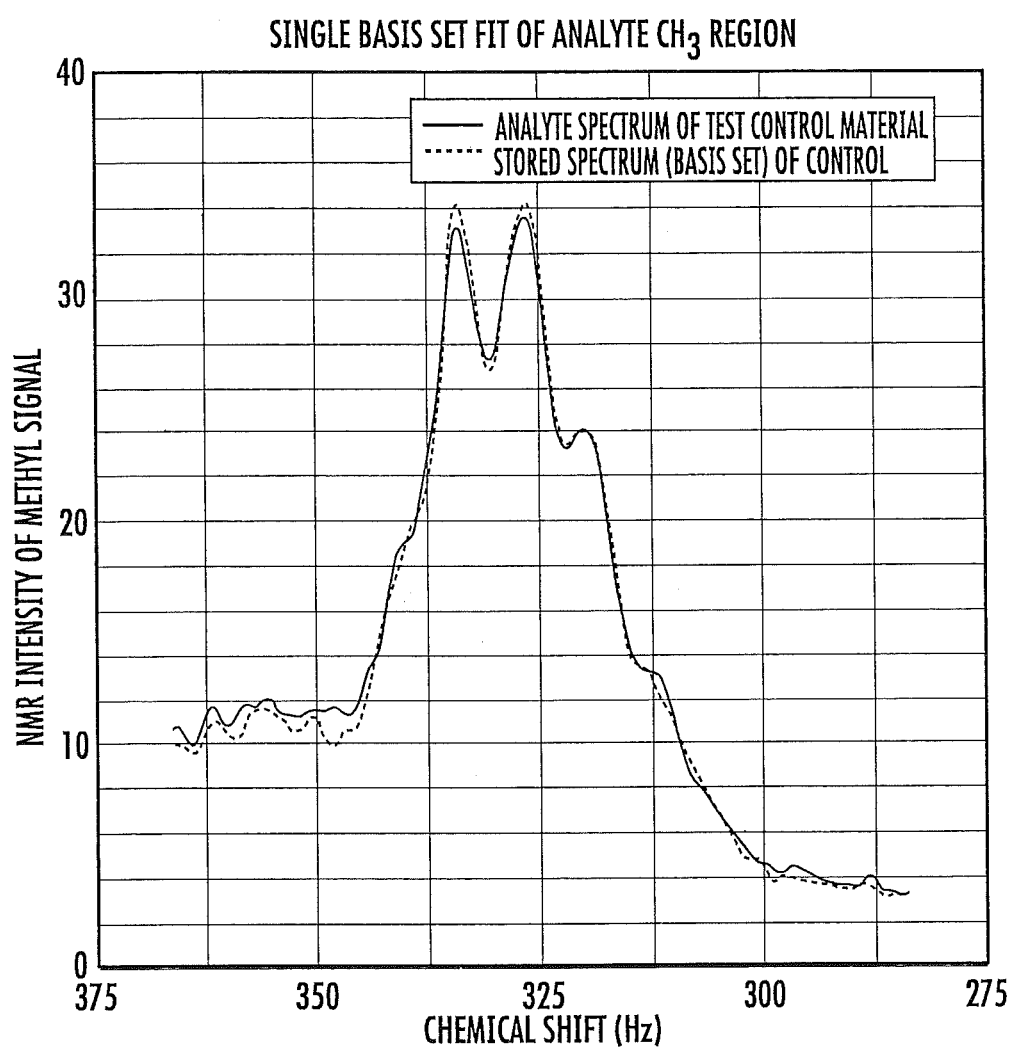
FIG. 3A is a schematic illustration of a single basis set of a priori data used with the $CH_3$ region of a proton NMR spectra of a blood plasma or serum sample according to embodiments of the present invention.

The present invention will now be described more fully hereinafter, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout, and thickness, size and dimensions of some components, lines, or features may be exaggerated for clarity. The order of operations and/or steps illustrated in the figures or recited in the claims are not intended to be limited to the order presented unless stated otherwise. Broken lines in the figures, where used, indicate that the feature, operation or step so indicated is optional unless specifically stated otherwise.

It will be understood that when a feature, such as a layer, region or substrate, is referred to as being "on" another feature or element, it can be directly on the other feature or element or intervening features and/or elements may also be present. In contrast, when an element is referred to as being "directly on" another feature or element, there are no intervening elements present. It will also be understood that, when a feature or element is referred to as being "connected", "attached" or "coupled" to another feature or element, it can be directly connected, attached or coupled to the other element or intervening elements may be present. In contrast, when a feature or element is referred to as being "directly connected", "directly attached" or "directly coupled" to another element, there are no intervening elements present. Although described or shown with respect to one embodiment, the features so described or shown can apply to other embodiments.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this application and should not be interpreted in an idealized or overly formal sense unless expressly so defined herein. As used herein, the term "and/or" includes any and all combinations of one or more of the associated listed items.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The term "biosample" includes whole blood, plasma, serum, urine, cerebral spinal fluid (CSF), lymph samples, stool samples, tissues, and/or body fluids in raw form and/or in preparations. The biosamples can be from any target subject. Subjects', according to the present invention, can be any animal subject, and are preferably mammalian subjects (e.g., humans, canines, felines, bovines, caprines, ovines, equines, rodents (mice, rats, hamsters, guinea pigs or others), porcines, primates, monkeys, and/or lagomorphs). The animals can be laboratory animals or non-laboratory animals, whether naturally occurring, genetically engineered or modified, and/or whether being laboratory altered, lifestyle and/or diet altered or drug treated animal variations.

The term "clinical" with respect to data measurements means qualitative and/or quantitative measurements that can be used for therapeutic or diagnostic purposes, and typically for diagnostic purposes and meets the appropriate regulatory guidelines for accuracy, depending on the jurisdiction or test being performed. The term "clinical" with respect to NMR analyzer is described above in the Summary section of the specification.

The term "automatic" means that substantially all or all of the operations so described can be carried out without requiring active manual input of a human operator, and typically means that the operation(s) can be programmatically directed and/or carried out. The term "electronic" means that the system, operation or device can communicate using any suitable electronic media and typically employs programmatically controlling the communication between a control system that may be remote and one or more local NMR analyzers using a computer network.

The term "computer network" includes one or more local area networks (LAN), wide area networks (WAN) and may, in certain embodiments, include a private intranet and/or the public Internet (also known as the World Wide Web or "the web"). The term "networked" system means that one or a plurality of local analyzers can communicate with at least one remote (local and/or offsite) control system. The remote control system may be held in a local "clean" room that is separate from the NMR clinical analyzer and not subject to the same biohazard control requirements/concerns as the NMR clinical analyzer.

As will be appreciated by one of skill in the art, the present invention may be embodied as an apparatus, a method, a data or signal processing system, and/or a computer program product. Accordingly, the present invention may take the form of an entirely software embodiment, or an embodiment combining software and hardware aspects. Furthermore, certain embodiments of the present invention may take the form of a computer program product on a computer-usable storage medium having computer-usable program code means embodied in the medium. Any suitable computer readable medium may be utilized including hard disks, CD-ROMs, optical storage devices, or magnetic storage devices.

The computer-usable or computer-readable medium may be, but is not limited to, an electronic, magnetic, optical, superconducting magnetic, infrared, or semiconductor system, apparatus, device, or propagation medium. More specific examples (a nonexhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium, upon which the program is printed, as the program can be electronically captured, via, for instance, optical scanning of the paper or other medium, then compiled, interpreted or otherwise processed in a suitable manner if necessary, and then stored in a computer memory.

Computer program code for carrying out operations of the present invention may be written in an object oriented programming language such as Java®, Smalltalk, Python, Labview, C++, or VisualBasic. However, the computer program code for carrying out operations of the present invention may also be written in conventional procedural programming languages, such as the "C" programming language or even assembly language. The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider).

The flowcharts and block diagrams of certain of the figures herein illustrate the architecture, functionality, and operation of possible implementations of analysis models and evaluation systems and/or programs according to the present invention. In this regard, each block in the flow charts or block diagrams represents a module, segment, operation, or portion of code, which comprises one or more executable instructions for implementing the specified logical function(s). It should also be noted that in some alternative implementations, the functions noted in the blocks may occur out of the order noted in the figures. For example, two blocks shown in succession may in fact be executed substantially concurrently or the blocks may sometimes be executed in the reverse order, depending upon the functionality involved.

Embodiments of the present invention may be used to analyze any in vitro biosample. The biosample may be in liquid, solid, and/or semi-solid form. The biosample may include tissue, blood, biofluids, biosolids and the like. However, as noted above, the automated clinical NMR analyzer may be particularly suitable to analyze lipoprotein data in in vitro blood serum and/or plasma samples. The small person-to-person variations in the lineshapes of the lipoprotein classes are caused by the subclass heterogeneity known to exist within each of these lipoprotein classes. FIG. 1 shows the lineshapes and chemical shifts (positions) for a number of subclasses of lipoproteins. As shown in FIG. 1, the chemical shifts and lineshape differences between the different subclasses are much smaller than those between the major lipoprotein classes, but are completely reproducible. Thus, differences among the NMR signals from the plasma of individuals are caused by differences in the amplitudes of the lipid resonances from the subclasses present in the plasma, which in turn are proportional to their concentrations in the plasma. This is illustrated in FIG. 2, in which the NMR chemical shift spectra of a blood plasma sample is shown. The spectral peak produced by methyl ($CH_3$) protons 60 (shown as a solid line) is shown for the blood serum sample in FIG. 2. The spectral peak 61 (shown as a dotted line) in FIG. 2 is produced by the arithmetic sum of the NMR signals produced by the lipoprotein subclasses of the major classes VLDL, LDL, HDL, proteins and chylomicrons, as illustratively shown by certain of the subclasses in FIG. 1. It can be seen that the lineshape of the whole plasma spectrum is dependent on the relative amounts of the lipoprotein subclasses whose amplitudes change (sometimes dramatically) with their relative concentrations in the plasma sample.

Since the observed $CH_3$ lineshapes of whole plasma samples are closely simulated by the appropriately weighted sum of lipid signals of their constituent lipoprotein classes, it is possible to extract the concentrations of these constituents present in any sample. This is accomplished by calculating the weighting factors which give the best fit between observed blood plasma NMR spectra and the calculated blood plasma spectra. Generally speaking, the process of NMR lipoprotein analysis can be carried out by the following steps: (1) acquisition of an NMR "reference" spectrum for each of the "pure" individual constituent lipoprotein classes and/or subclasses of plasma or serum of interest and/or related groupings thereof; (2) acquisition of a whole plasma or serum NMR spectrum for a sample using measurement conditions substantially identical to those used to obtain the reference spectra; and (3) computer deconvolution of the NMR spectrum in terms of the constituent classes and/or subclasses (or related groupings thereof) to give the concentration of each lipoprotein constituent expressed as a multiple of the concentration of the corresponding lipoprotein reference.

Although the procedure can be carried out on lipoprotein classes, carrying out the process for subclasses of lipoproteins can decrease the error between the calculated lineshape and the NMR lineshape, thus increasing the accuracy of the measurement while allowing for simultaneous determination of the subclass profile of each class. Because the differences in subclass lineshapes and chemical shifts are small, for certain applications, it may be important to correctly align the reference spectrum of each subclass with the plasma spectrum.

The alignment of these spectra can be accomplished by the alignment of control peaks in the spectra, which are known to respond in the same manner to environmental variables, such as temperature and sample composition, as do the lipoprotein spectra. As is known, one such suitable alignment peak is the peak produced by CaEDTA found in prepared (diluted) sample mixtures, although other EDTA peaks or suitable peak may be utilized. By alignment of the spectra, the small variations in the subclasses' lineshapes and chemical shifts may be exploited to produce higher accuracy and subclass profiles.

Further description of these methods can be found in U.S. Pat. Nos. 4,933,844 and 5,343,389 to Otvos. The mathematics used in the lineshape fitting process (i.e., least squares fit of an unknown function in terms of a weighted sum of known functions) is well known and is described in many textbooks of numerical analysis, such as F. B. Hildebrand, *Introduction to Numerical Analysis,* 2nd edition, pp. 314-326, 539-567, McGraw-Hill, 1975.

Validation Control Material and Operational Status Evaluation

In the past, as part of start-up or periodic quality assessment, at least two types/levels of control material samples were introduced into the NMR spectrometer and multiple NMR derived lipoprotein parameters were assessed (compared to stored values) for conformance to expected results for quality control review.

In some embodiments of the present invention, it is contemplated that the multiple variables previously reviewed can be reduced to a single variable by performing spectral deconvolution of the $CH_3$ region of the spectra or other suitable region for at least one validation control material sample. The analyte NMR lineshape can be deconvoluted using multivariate analysis with non-negative constraints. See, e.g., Lawson, C. L., Hanson, R. J. *Solving Least Squares problems*. Philadelphia, Pa.: SIAM, 1995, pp. 160-165.

The analyte spectra array consists of "m" discrete data points denoted $P_i^o$, where i=1, 2 ... m. The method for fitting the validated control spectrum, $P_i^o$, with a linear combination of n constituent spectra is based on the premise that there are a set of coefficients, $c_j$, corresponding to the contributions of component j, and a coefficient, $c_p^1$, corresponding to the imaginary portion of the sample plasma spectrum, such that for each data point, $P_i^o \approx P_i^c$, where $$P_i^c = \sum_{j=1}^{n} c_j V_{ji} + c_p^1 V_i^I. \qquad \text{EQUATION (1)}$$

The best fit can be obtained by minimizing the root mean square error in a manner analogous to that previously described in U.S. Pat. No. 6,617,167, except that $V_j$ represents only the single (j=1) basis set of the validated control spectra array stored in the computer. The contents of this patent are hereby incorporated by reference as if recited in full herein.

The correlation coefficient, r, of the fit of control spectra of the $CH_3$ region as a function of the stored validated control spectra will be used along with coefficient $c_j$ to determine the acceptability of status of the analyzer to acquire clinical data. In certain embodiments, both r and $c_j$ can be as chosen to be as close to 1.0 as practicable and/or possible. Acceptable limits for deviation from 1.0 can be established in consonant with standard clinical practices mandated by CLIA.

The phrase "validation control material sample" refers to a priori or known measurement values of a known reference sample, the known sample corresponding to those types of samples that will be undergoing evaluation using the equipment and analysis software (whatever biotype, i.e., blood plasma or serum, urine, etc). The spectral deconvolution of the $CH_3$ region of the spectra of the control material can be carried out using the single basis set of the stored spectra of the validated known control samples. Thus, a known validation sample can be analyzed and its associated values can be stored as known or control values. Periodically, the validation control sample can be reanalyzed by the NMR system to confirm that the test values conform to the stored (expected values). The NMR analyzer can be configured to flag or alert when there is undue departure from predetermined norms so that the system can be recalibrated.

The validation control sample and validation control protocol can typically be run at start-up (each shift or daily) and at increased intervals as needed. The increased intervals may be based on signal degradation of the proton NMR spectrum lineshape (width/height), when an unknown sample is quantified outside normal bounds and/or upon other automatically detected and monitored parameters.

Undiluted Samples

Figure 3B:
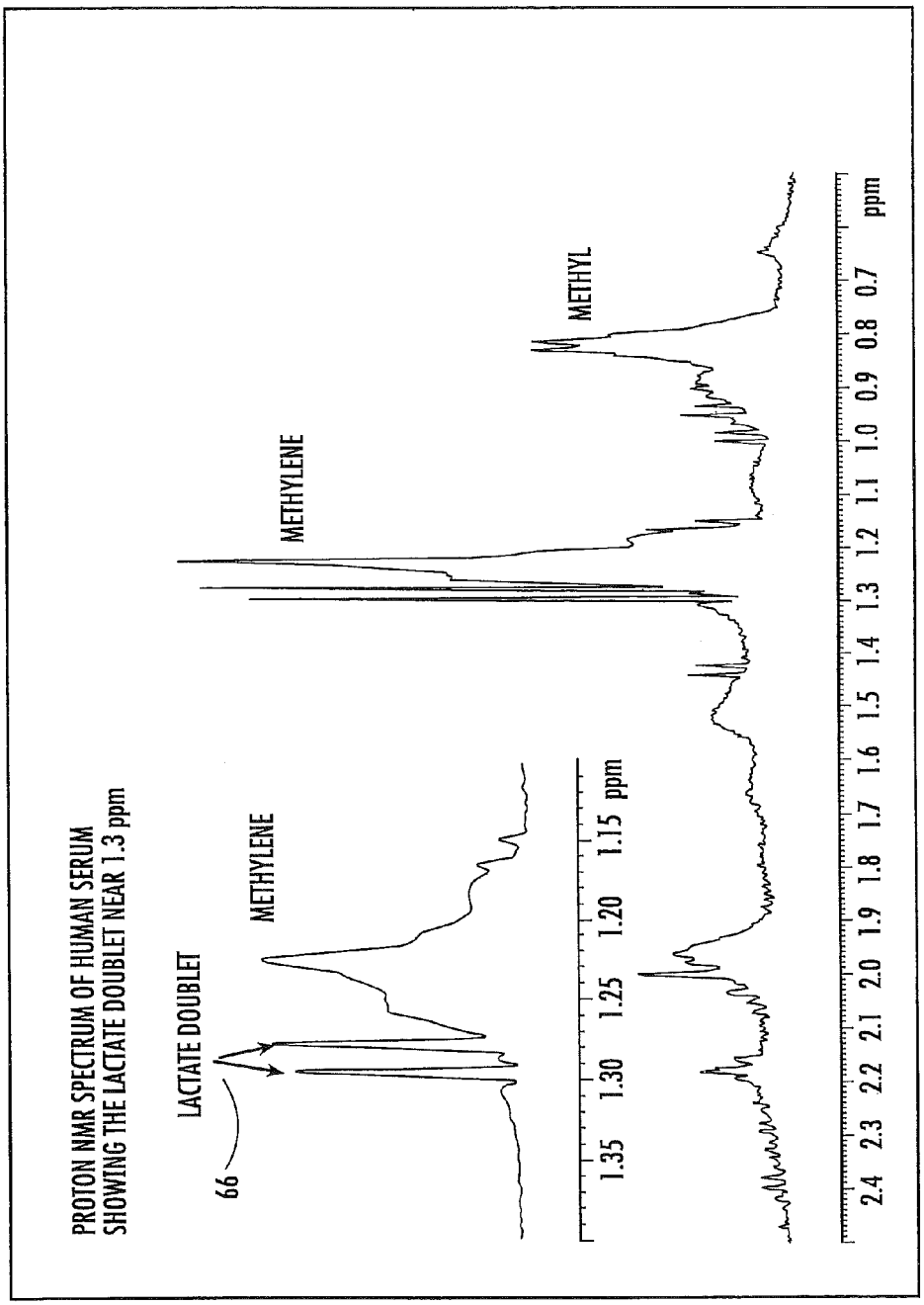
FIG. 3B is a graph of a proton NMR spectrum of serum with a lactate doublet useable for spectral alignment according to embodiments of the present invention.
Figure 3C:
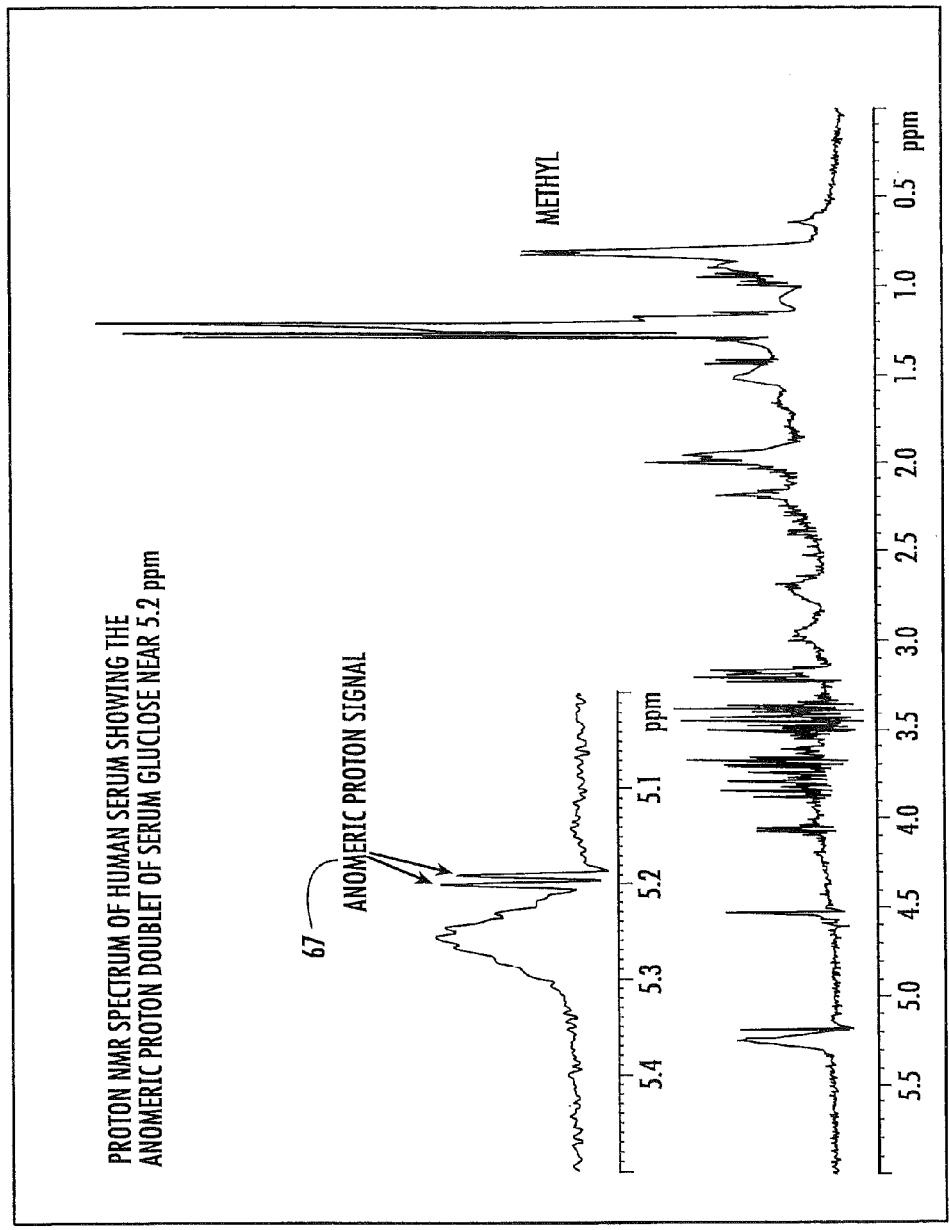
FIG. 3C is a graph of a proton NMR spectrum of serum with an anomeric glucose doublet useable for spectral alignment according to embodiments of the present invention.

In certain embodiments, the NMR clinical analyzers 10 (FIG. 4) can be configured to analyze undiluted (neat) plasma and/or serum. Unfortunately, a CaRDTA peak may not appear when the sample is undiluted serum, which can impede spectral referencing for deconvolution. Thus, in certain embodiments, as shown in FIG. 3B, a lactate doublet 66 generally centered about 1.3 ppm in the proton NMR spectrum of serum can be used for spectral referencing and alignment for NMR derived quantification analysis (such as lipoprotein quantification of serum samples). In other embodiments, as shown in FIG. 3C, an anomeric proton signal from the glucose in serum can appear as a doublet 67 at about 5.2 ppm and this doublet may also be used (with or alone) as an anchor point for spectral alignment.

Network of Clinical Analyzers

Figure 4:
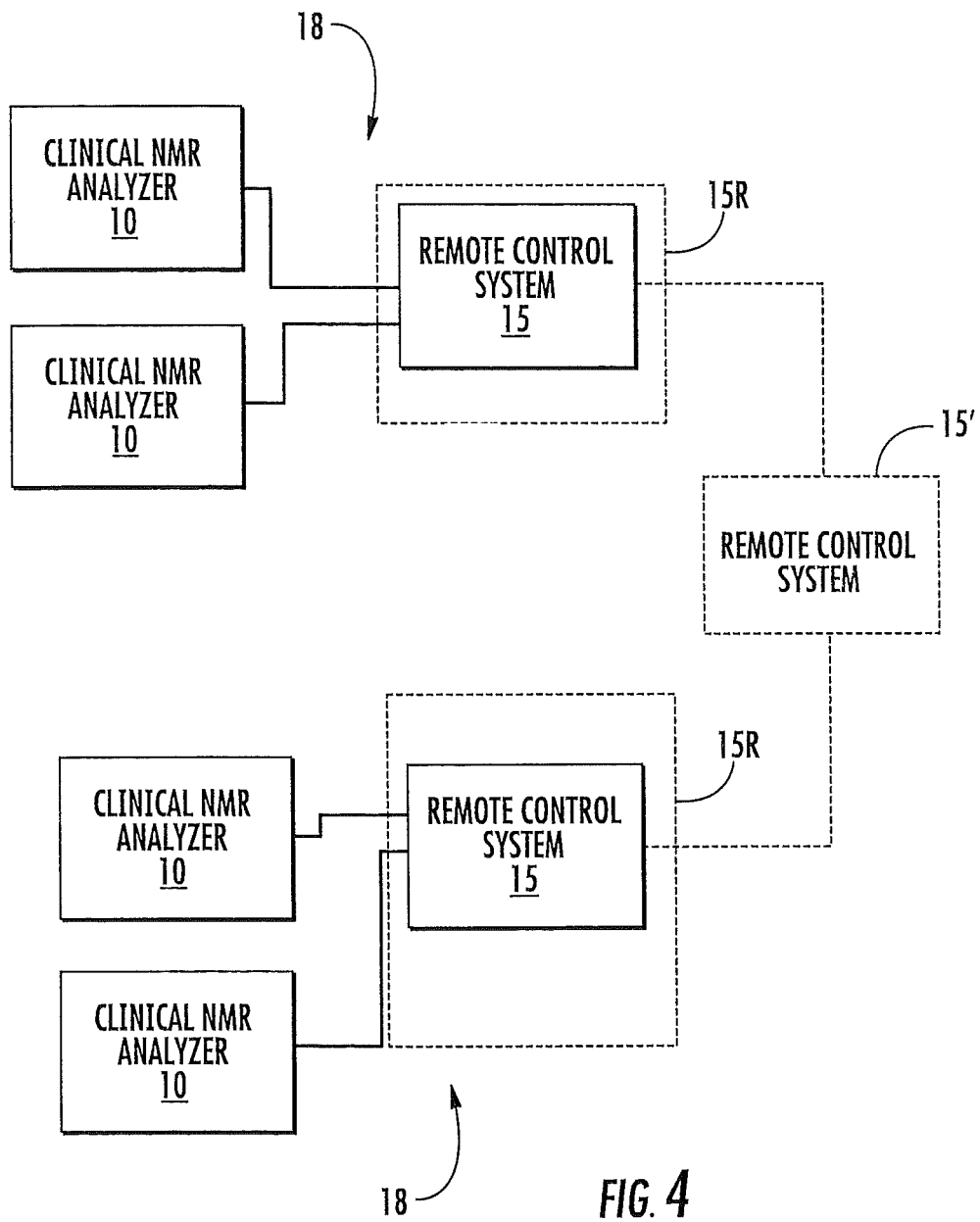
FIG. 4 is a schematic illustration of a networked system of a plurality of local clinical NMR analyzers that are in communication with an automated remote service/support system according to embodiments of the present invention.

As shown in FIG. 4, certain embodiments of the invention are directed to a networked system 18 of clinical NMR analyzers 10. The networked system 18 includes at least one clinical NMR analyzer 10 that communicates with at least one remote system 15. Typically, a plurality of clinical NMR analyzers 10 located at a common local use site communicate with a respective at least one remote service/support system 15. The at least one remote system 15 can be configured to monitor selected local operating parameters associated with each clinical NMR analyzer 10. In some embodiments, each local site may include a plurality (at least two) NMR analyzers 10, which may be configured to communicate with each other and/or at least one remote control system 15. The at least one remote control system 15 may be configured as a common local or offsite control station for a plurality of different local analyzers 10 (typically for all of the local analyzers at a use site). The at least one remote control system 15 can be a plurality of generally independent stations configured to communicate with one or selected local analyzers 10. In other embodiments, the at least one control system 15 can be a plurality of remote control systems 15 that may be in communication with another offsite control station 15' as optionally shown in FIG. 4. Each respective local analyzer 10 can communicate with a common remote control system 15 or a plurality may communicate with different control systems and/or sites. The local analyzers 10 may also be configured to operate independently of the others and/or not to communicate with each other. The broken line box 15R drawn around the remote control box in FIG. 4 illustrates that the remote control system(s) 15 can be located on-site (in the same facility) but in a room 15R that is enclosed and away from the NMR Analyzers 10 so as to not be under the same biohazard, laboratory access/cleanliness or operation restrictions as the NMR clinical analyzer itself 10.

In some embodiments some of the local analyzers 10 may be configured to communicate with each other directly or indirectly using the control system 15, such as, but not limited to, those at affiliated locations or a common local site. The communication can be electronic communication such as (a) wireless, which may be carried out using mobile communications and/or satellite systems, (b) via an intranet, (c) via a global computer network such as the Internet, and/or (d) use a POTS (land based "plain old telephone system"). The system 18 may use combinations of communications systems.

The local analyzers 10 may be controlled by the remote system 15 in a manner that allows for interactive adjustment during operation, such as during the NMR analysis and/or start-up or calibration mode. As such, the operational and/or test analysis data can be relayed to the remote control system 15 in substantially "real-time". The NMR analyzers 10 can be configured to interactively communicate with the remote control system 15 to allow "smart" monitoring status. For example, the NMR analyzer 10 can automatically send a signal alerting the control system 15 when a test is complete for a subject, allowing the control system 15 to timely obtain the data therefrom and generate the test report using the data.

In some particular embodiments, the system 18 can include a data processing system, which comprises a web server. In particular, the data processing system may be an Internet Appliance, such as a PICOSERVER® appliance by Lightner Engineering located in San Diego, Calif. (see also www.picoweb.net) or other such web servers, including, but not limited to, those available from Axis Communications, or PICOWEB, RABBIT, and the like. The data processing system can receive commands from the support site 15 and controls certain operational parameters of the system 10. The data processing system can also include a TCP stack and Ethernet NIC to provide the communication link between the computer network 10 and the test administration site 15.

The processing system can provide information about the local analyzers 10 to the administration site 15 as web pages which may be predefined and stored at the local device 10. Such web pages may also be dynamically generated to incorporate test specific information. The web pages may be Hypertext Markup Language (HTML) common gateway interface (CGI) web pages which allow for user input by a client, such as a web browser, of a user at the test administration site 15. The web pages may also be or include Java scripts, Java applets or the like which may execute at the test administration site so as to control operations of an administration data processing system at the administration site 15. As will be appreciated by those of skill in the art, other mechanisms for communicating between a web server and a client may also be utilized. For example, other markup languages, such as Wireless Markup Language (WML) or the like, for communicating between the local device 10 and the administration site 15 may be utilized.

In certain embodiments, operations of a web server and a web client can include a web browser as the administration site 15 that requests an initial web page from the web server of the local device 10. Such a request may take the faun of a Hypertext Transfer Protocol (HTTP) request to the IP address of the web server of the local device. The IP address may be pre-assigned to the local device 10 or may be dynamically assigned when the local device 10 attaches to the network 15. Thus, the web browser may know in advance the IP address of the local devices 10 or may be notified of the IP address as part of a setup procedure.

When the local device 10 receives the request for the initial web page, it sends the initial web page and a Java applet which causes the web browser to periodically reload its current web page. Alternatively, "push" technology could be employed by the server to push data to the web browser when status is to be updated. The rate at which the web page is reloaded may be based on the type of data relayed or detected and/or the web page being displayed. Similarly, the rate may also be based on the type of network connection utilized such that for slower connection types the refresh rate could be reduced. In some embodiments, the Java applet could be generated once with the initial web page, while in others the Java applet could be provided with each web page, and the refresh rate could be based on the particular web page provided. For example, a setup web page could be refreshed less often then a test status web page (or not at all).

In any event, after the initial web page is provided to the web browser, the web server of the local devices 10 waits for a subsequent request for a web page. When a request is received, it may be determined if the request is for a response to an operational status inquiry, such as lineshape width and/or height of the last two samples, which is to be included in the responsive web page. If so, then the web page may be revised to indicate the information. In any event, it may also be determined if the request specifies parameters for the inquiry by, for example, providing a CGI request which reflects user input to the web browser. If so, the parameters are set based on the CGI specifications and the web page corresponding to the URL of the request is returned to the web browser. If the inquiry is terminated, then operations may terminate. Otherwise, the web server waits for the next request from the web browser.

In some embodiments, the clinical NMR analyzers 10 include a high field NMR superconducting magnet and the remote system automatically obtains data regarding homogeneity of the magnetic field generated by the superconducting magnet. The homogeneity data can include data regarding the lineshape characteristics of biosamples undergoing analysis (which can indicate a degradation in homogeneity over time). In some embodiments, the local NMR analyzer 10 generates and stores an electronic history file of selected operational parameters. The local NMR analyzers 10 can be configured to review and generate an automatic approval of each sample test results and/or a retest (reject) decision.

The history file can be configured to be electronically accessible by the remote system 15. In some embodiments, the local analyzers 10 and/or remote system 15 are configured to automatically monitor process variables and statistically analyze data corresponding to measurements of the monitored process variables to thereby perforin an automated quality control analysis. In particular embodiments, the local systems 10 are configured to automatically adjust operating equipment to keep the process variables within a predetermined statistical variation responsive to the monitored data. The local systems can be configured to automatically generate an alert when an abnormal operating condition is detected. In other embodiments, the remote system 15 is configured to automatically generate an alert when an abnormal operating condition is detected at the local NMR analyzer site(s) 10. The local analyzers 10 can be configured to generate an electronic service log and/or an electronic process history log that is electronically accessible by the remote system 15.

The local analyzers 10 can be configured to automatically detect temporally relevant data of selected operational parameters at desired intervals and generate an electronic maintenance file thereof, and the local NMR analyzers 10 can be configured to electronically store their respective maintenance files for electronic interrogation by the remote system 15. The selected operational parameters can include the NMR signal lineshape and/or scaling thereof of one or more patient samples. The maintenance file may include respective patient sample identifiers correlated to selected operational parameters measured at a time the NMR signal of the patient sample was obtained, and may also include a time and/or date stamp or data. The local NMR analyzers 10 can be configured to generate an electronic maintenance file of selected operational parameters for each sample processed. The local NMR analyzers 10 can electronically store (at least temporarily) sample data correlated to an accession patient identifier and/or sample dilution factor.

In some embodiments, the local analyzer 10 can generate an electronic log of NMR sample data that is analyzed for one or more biosamples and the log can be configured to be accessible by the remote system 15. In certain embodiments, an operator or service program at the remote system 15 determines when to send (and places the service order for) technical support onsite to the local clinical analyzers 10.

In particular embodiments, the remote system 15 automatically controls selected features of the local clinical NMR analyzers 10. The local NMR analyzers 10 can be configured with a user interface that accepts local user input to select a report format and/or sample variables of interest for NMR analysis, thereby allowing customizable report formats by site/region. Patient reports generated by the analyzers 10 at each local clinical NMR analyzer site can have a site identifier thereon and the report can be generated in electronic and/or paper form.

To help monitor the number of tests performed, the remote system 15 can automatically obtain data regarding the number of patient samples analyzed over a desired interval on each clinical NMR analyzer 10. This monitoring can allow the remote control system to order consumables based on projected and/or actual needs customized to a particular site.

In some embodiments, each NMR analyzer 10 can include an electronic library of predetermined computer program functions that refer to a NMR normalization factor used to carry out quantification measurements. The NMR analyzers 10 can be configured to obtain NMR derived concentration measurements of lipoproteins in a blood plasma and/or serum sample. In some embodiments, the NMR analyzers 10 can be configured to obtain NMR derived concentration measurements of one or more of LDL, HDL, and/or VLDL subclass particles in a blood plasma and/or serum sample and/or configured to determine: (a) a patient's risk of having and/or developing CHD based on the lipoprotein measurements; and/or (b) a patient's risk of having and/or developing Type II diabetes or other insulin resistance disorders.

In certain embodiments, each clinical NMR analyzer 10 can be configured to automatically execute a start-up self-diagnostic and/or tuning/calibration routine and relay abnormal data regarding same to the remote control system 15. The clinical NMR analyzers 10 can be configured to automatically monitor the NMR signal lineshapes, and/or determine a height and/or width thereof, over time, to monitor if adjustments to equipment are indicated. For example, the clinical NMR analyzers 10 include a high field superconducting magnet and the clinical NMR analyzers can be configured to automatically shim the NMR spectroscopic magnetic field to provide increased homogeneity if the line widths degrade beyond a desired amount.

In some embodiments, the clinical NMR analyzers 10 can be configured to automatically adjust scaling of the NMR lineshape of the proton NMR spectrum of the biosample when the height and/or width thereof is outside a desired range.

In some embodiments, one of the selected operational parameters monitored for can be RF excitation pulse power. The clinical NMR analyzers 10 can be configured to automatically adjust the RF excitation pulse power (increase or decrease the RF amplifier, if the power is outside a desired operating range and/or varies from pulse to pulse (and/or sample to sample) by more than a predetermined amount and/or percentage. The clinical NMR analyzers 10 can be configured to disregard and/or invalidate NMR signal data obtained when power variation of the RF pulses is greater than a predetermined amount. In some embodiments, when large RF power changes are detected, the analyzer 10 can be configured to disregard, flag as error-prone and/or invalidate the sample data. In some embodiments, increased accurate control of RE power monitoring can be obtained by using a controlled sample introduced into the analyzer 10 at desired intervals, such as a standard solution containing TMA.

The networked system 18 can be configured to monitor, in substantially real time, at least intermittently and/or at desired intervals, certain parameters associated with the operational status of the NMR analyzer 10 during operation. The system 18 may go into a standby mode during non-active periods (down shifts), but monitor for certain major parameters, such as cryogen level, electronic circuitry over-temperature, and the like.

Automated Clinical NMR Analyzer

Figure 5:
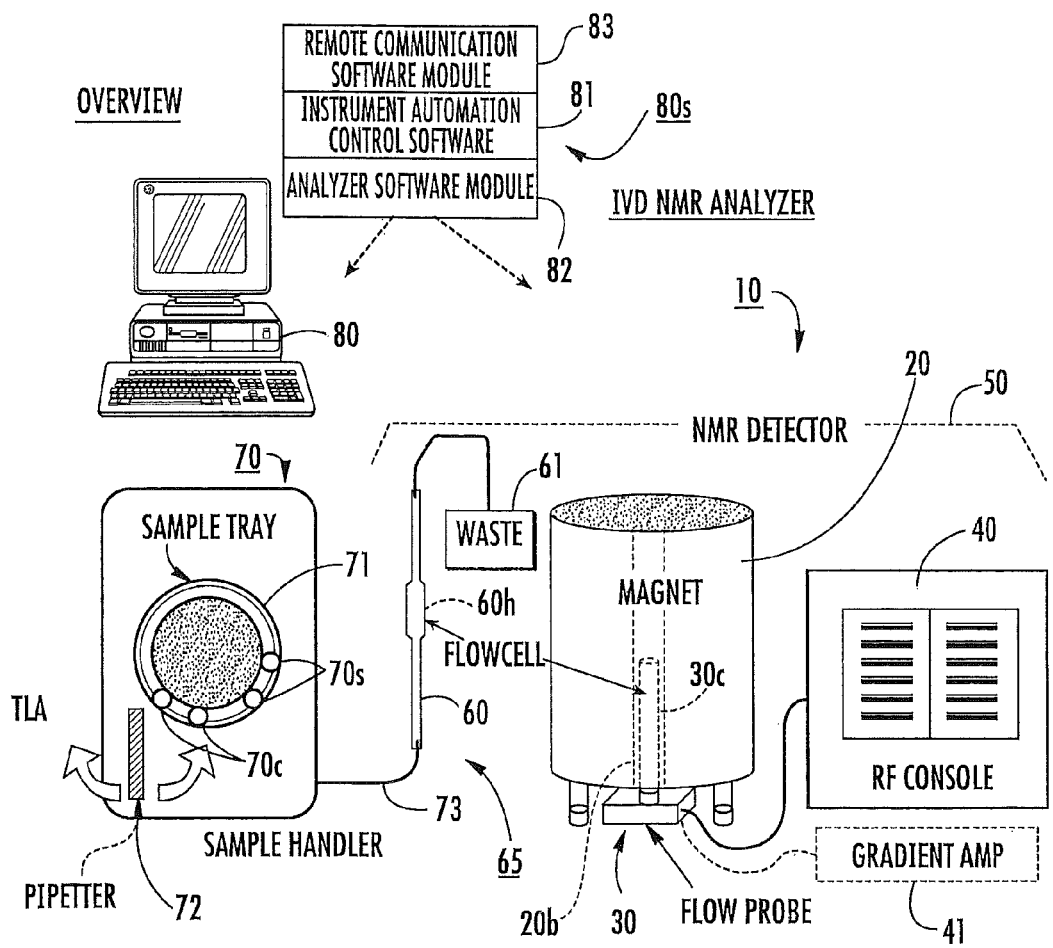
FIG. 5 is a schematic illustration of an in vitro diagnostic NMR analyzer according to embodiments of the present invention.

FIG. 5 is a schematic diagram of one example of an in vitro diagnostic (IVD) clinical NMR analyzer 10. As shown, the analyzer 10 includes an NMR detector 50, an enclosed flow path 65, an automated sample handler 70, and a controller/processor 80 (shown as a CPU) with operational software 80s. The term "NMR detector" may also be known as an NMR spectrometer as will be appreciated by those of skill in the art. The NMR detector 50 includes a magnet, typically a cryogenically cooled high field superconducting magnet 20, with a magnet bore 20b, a flow probe 30, and RF pulse generator 40. The term "high-field" magnet refers to magnets that are greater than 1 Tesla, typically greater than 5 Tesla, and more typically greater than about 9 Tesla. Magnetic fields greater than about 13 Tesla may, in some situations, generate broader lineshapes, which in some analysis of some biosamples, may not be desirable. The flow probe 30 is in communication with the RF pulse generator 40 and includes an RF excite/receive circuit 30c, such as a Helmholtz coil. However, as will be appreciated by those of skill in the art, other excite/receive circuit configurations may also be used.

It is noted that although illustrated as a system that serially flows biosamples using a flow cell 60, other sample handlers 70 and biosample introduction means can be used. For example, the biosample can be processed as it is held in a respective tube or other sample container (not shown). In some embodiments, each of the modular components of the NMR analyzer 10 may be sized and configured to fit within a single housing or enclosure.

Field homogeneity of the detector 50 can be adjusted by shimming on a sample of about 99.8% $D_2O$ until the spectral linewidth of the HDO NMR signal is less than 0.6 Hz. The 90° RF excitation pulse width used for the $D_2O$ measurement is typically about 6-7 microseconds. Other shimming techniques can also be used. For example, the magnetic field can be automatically adjusted based on the signal lineshape and/or a width or height thereof. The NMR detector 50 may optionally include a gradient amplifier in communication with gradient coils 41 held in the magnet bore 20b as is well known to those of skill in the art, and the gradient system may also be used to help shim the magnet.

During operation, the flow probe 30 is held inside the magnet bore 20b. The flow probe 30 is configured to locate the flow probe RF circuitry 30c within the bore 20b to within about +/−0.5 cm of a suitably homogeneous portion of the magnetic field $B_0$. The flow probe 30 is also configured to receive the flow cell 60 that fauns part of the biosample enclosed flow path 65. The flow cell 60 typically includes a larger holding portion 60h that aligns with the RF circuitry 30c of the flow probe 30. The flow cell 60 is configured to remain in position with the holding portion 60h in the magnet bore 20b and serially flow biosamples to the holding portion 60h, with successive biosamples being separated by a fluid (typically air gaps) to inhibit cross-contamination in a flowing stream. The samples may be introduced as a train of samples, but are more typically introduced (injected) one at a time. The biosample is typically held in the holding portion 60h for between about 1-5 minutes during which time a proton NMR spectrum is obtained and electronically correlated to the sample accession number or identifier (i.e., a patient identifier). The flow cell 60 can be formed of a non-magnetic material that does not degrade the performance of the NMR detector 50. Typically, the flow cell 60 is formed of a suitable grade of silicate (glass) material, however, other magnetic-friendly non-porous materials may be used including ceramics, polymers, and the like.

A magnetically-friendly optic viewing scope (such as a fiber optic system) may be used to allow a user and/or the system 10 to visually monitor conditions in the magnet bore 20b (i.e., position of the probe, leaks or the like) (not shown). The viewing scope can be mounted to the bore or made integral to the flow cell 60 or the flow probe 30. Similarly, at least one leak sensor can be placed to automatically detect fluid leakage, whether biosamples, cleansers or cryogens. If the former, a leak sensor can be used to detect leaks caused by flew path disruption; if the latter a gas sniffer type sensor can be used. The gas sensor can be located away from the probe. Cryogen level sensors can also be used to monitor the level of the liquid (helium and/or nitrogen) to allow for automated supply orders, identification of an increased use rate (which may indicate a magnet problem), and the like.

In the embodiment shown, the flow cell 60 is in fluid communication with a waste receptacle 61 at one end portion and a sample intake 73 on the other end portion. In certain embodiments, the analyzer 10 is configured to flow the samples from top to bottom using a flow cell 60 that has a major portion that is substantially straight (i.e., without bends) to reduce the length of the flow path 60 and/or to reduce the likelihood that the bends in a flow path will block the flow. In some embodiments, the flow cell 60 is entirely straight. In particular embodiments, the entire flow path 65 may be straight throughout its length (including portions upstream and downstream of the flow cell 60, from intake to discharge into the waste container). In other embodiments, elastomeric, typically polymeric, conduit and/or tubing (which may comprise TEFLON) can be used to connect the flow cell 60 to the sample intake portion of the flow path 65 and the conduit and/or tubing may be bent to connect to mating components as desired. However, it the conduit/tubing extend into the magnet bore 20*b*, then that part of the flow path 65 may also be configured to be straight as discussed with respect to the flow cell 60.

In some embodiments, the flow cell 60 has an inner diameter of between about 0.5 mm to about 0.8 mm upstream and downstream of the holding portion 60*h*. The downstream portion is typically at least about 0.8 mm to inhibit clogs in the flow system. The holding portion 60*h* may have a diameter that is between about 1.0 mm-to about 4.0 mm.

The biosamples may be configured in appropriate sample volumes, typically, for blood plasma or serum, about 0.5 ml. For whole plasma, a reduced sample size of about 50-300 microliters, typically about 60-200 microliters, and more typically between about 60-100 microliters may be desired. In some embodiments, the sample flow rate may be between about 2-6 ml/min to flow the sample to the holding portion 60*h* for the NMR data collection and associated analysis.

Still referring to FIG. 5, the automated sample handler 70 may be configured to hold a plurality of samples 70*s* in suitable sample containers 70*c* and present the samples 70*s* in their respective container 70*c* to an intake member 72 that directs the sample into the enclosed flow path 65. The sample bed 71 may hold about 50-100 samples in containers. In some embodiments, the bed 71 may optionally be configured to provide and/or held in a refrigerated or cooled enclosed compartment. In other embodiments, conventional small and/or large racks of sample tubes can be used. Typically, the intake member 72 is configured to aspirate the sample into the flow path 65. As shown, the intake member 72 comprises a pipetter and/or needle that withdraws the desired sample amount from the container 70*c*, and then directs the sample (typically via injection through an injection port) into a conduit 73 that is in fluid communication with the flow cell 60. The pipette may rotate about 180 degrees to access tray samples or a lab automation system (TLA, workcell, etc.). However, other sample transfer means may also be used. In other embodiments, the intake member 72 can be in direct communication with the flow cell 60 without the use of an intermediate conduit 73. In particular embodiments, the samples may be directly aspirated from a source tube on the sample handler tray. The sample handler system 70 can be configured to provide rapid flow cleaning and sample delivery. In particular embodiments, the handler system 70 can be configured to operate on about a 1-minute or less cycle (excluding NMR data acquisition) while reducing dilution and/or carryover.

A multi-port valve (which may replace or be used with the injection port) may be used to help reduce unwanted sample dilution due to flow cleaning carried out between samples. In certain embodiments, the intake member 72 includes an aspiration needle that can be quickly dried using a non-contact means, such as forced air or gas, rather than conventional blotter paper to inhibit blockage of the needle. The flow cell 60 may include chromatography connectors that connect the flow cell 60 to tubing or plumbing associated with the flow path 65.

In some embodiments, the analyzer 10 can be configured to direct the aspiration to blow out the injection port immediately after injecting a first sample before pre-fetching a next sample to maintain liquid-air gaps between neighboring samples.

The sample containers 70*c* can be held in beds 71 that can be loaded and placed in queue for analysis. The samples 70*s* are electronically assigned a patient identifier to allow electronic correlation to the test results. Conventionally, the beds 71 include bar codes that are automatically read and input into the computer as electronic records as a batch of samples, thereby inhibiting adjusting test parameters for a particular sample. In some embodiments, the NMR analyzer system 10 is configured so that the point of identification of each sample is carried out automatically at the point of aspiration. Thus, an optic or other suitable reader can be configured to define a patient identifier to a particular sample while the sample is being aspirated. In any event, the system control software 81 can be configured to create an archivable patient data file record that includes the patient identifier (also known as an accession number) as well as a dilution factor, the NMR-derived measurement values, test date and time, and "common" rack identifier, where used, and other process information that can be electronically searched as desired for service, operational and/or audit purposes. The electronic records can be relayed to a storage location (such as a central collection site within each region or country) and/or stored locally.

In operation, NMR-derived quantitative measurement data for diagnostic clinical reports of patient biosamples can be generated by: (a) automatically serially aspirating biosamples of interest into an enclosed flow path that serially flows the biosamples into an NMR analyzer having a NMR spectroscopy instrument with a magnet and a bore at a plurality of different clinical sites; (b) automatically correlating a patient identifier to a respective patient biosample; (c) and obtaining NMR derived quantitative measurements of the biosamples for diagnostic reports. In some particular embodiments, the operation may also include (d) automatically monitoring the NMR analyzers at the different clinical sites from a remote system.

Referring again to FIG. 5, the system 10 includes a controller/processor 80 that is configured with computer program code 80*s* that includes and/or is in communication with instrument automation control software 81, analytical software 82, and/or remote communication software 83. The control software 81 can primarily direct the automated operational sequences and monitoring protocols of the system 10 while the analytical software 82 typically includes proprietary software that carries out the quantitative measurements of the biosamples undergoing analysis using the NMR-spectrum thereof. For at least the analytical software 82, the processor 80 may include a digital signal processor capable of performing rapid Fourier transformations.

The remote communication software 83 is configured to carry out and/or facilitate the communication between the local analyzer(s) and remote control system 10, 15, respectively. The controller/processor 80 may be configured as a single processor or a plurality of processors that communicate with each other to provide the desired automated interfaces between the system components.

In certain embodiments, it may be desired to maintain the temperature of the sample undergoing NMR evaluation at a desired temperature. For example, for blood plasma and/or serum samples, it is typically desired to maintain the temperature of the sample at about 48° C.

In certain embodiments, the system 10 includes a plurality of spatially distributed temperature sensors along the flow path 65 that monitor the temperature of the sample undergoing analysis (not shown). The sample temperature can be determined at different times in the analysis including (a) prior to the sample entering the magnet bore 20*b*, (b) prior to initiating the RF pulse sequence, and/or (c) at the time and location of discharge from the probe, without disturbing the NMR lineshape in a manner that would impede NMR data collection/reliability. The temperature can be monitored during the NMR data acquisition (such as at least every 2-5 seconds). The sample can be actively cooled and/or heated during the evaluation to maintain a substantially constant homogeneous sample temperature without undue thermal gradients.

The system can include cooling and heating means that are configured to provide distributed heating and/or cooling for reducing hot spots in the sample. One type of heater is a capillary heater that may be slipped over the outer surface of the flow cell 60. An example of a heater is described in U.S. Pat. No. 6,768,304 to Varian, Inc., the contents of which are hereby incorporated by reference herein. It is contemplated that a longer capillary heater can be used that extends above the flow cell 60 (where the sample is flowed into the bore 20*b* from the top) and may have a length that is sufficient to extend about a major part of the flow path length. In some embodiments, the system 10 can include a heater that is highly conductive with a relatively large thermal mass (similar to a heat sink) that is above the probe 30 (where the flow is from top to bottom), and/or above the flow cell holding portion 60*h* to thereby improve distributed heating while reducing the likelihood of overheating of the sample as it travels to the probe 30. The large thermal mass may be located outside the magnet bore 20*b*.

In some embodiments, a circulating or forced supply of temperature-controlled gas can be flowed into the magnet bore to maintain the sample at a desired temperature during the NMR analysis. The temperature of the forced air can be adjusted relatively quickly in response to in situ measured sample temperature(s). To reduce moisture that may be inadvertently directed into sensitive electronics in the probe or spectrometer, the gas can be filtered and/or dried prior to introduction into the magnet bore 20*b*.

Typically, the samples are preheated from a cooled storage temperature. The auto sample handler 70 can hold the samples while in queue and gradually heat the sample in stages prior to the injection/input port to provide a sample that is preheated to a desired temperature range (such as about 45-47.9° C.). Alternatively, the sample may not be heated until it is in the flow cell 60. In some particular embodiments, the handler 70 may also be configured to hold the samples, in a refrigerated or cooled state. Combinations of both heating techniques may be used. Thus, the system 10 can include thermal sensors along the path the samples travel on/in the handler 70 and/or flow path 65 that detect the temperature thereof and provide real-time feedback to allow the system 10 to automatically adjust for any deviation from predicted or norm.

In any event, the system 10 can include a sensor module that electronically communicates with processor 80 and accepts/monitors electronic data output from sensors regarding the status of the sensors.

The flow path 65 may be configured with a valved flow bypass channel (not shown) that bifurcates out of and into the flow path 65 and/or flow cell 60 to allow selected samples to be redirected back into the flow path 65 above the magnet bore 20*b* after the sample exits the probe 30 but before it reaches the waste container 61 when a data corruption event is detected (not shown). The bypass channel could be in fluid communication with a solvent cleaner that allows automatic flushing of the bypass channel after use. In other embodiments, the sample(s) affected can be flushed into the waste receptacle and the analyzer 10 and/or remote control system 15 can generate a retest notice or order for that subject.

Modularity

Figure 6:
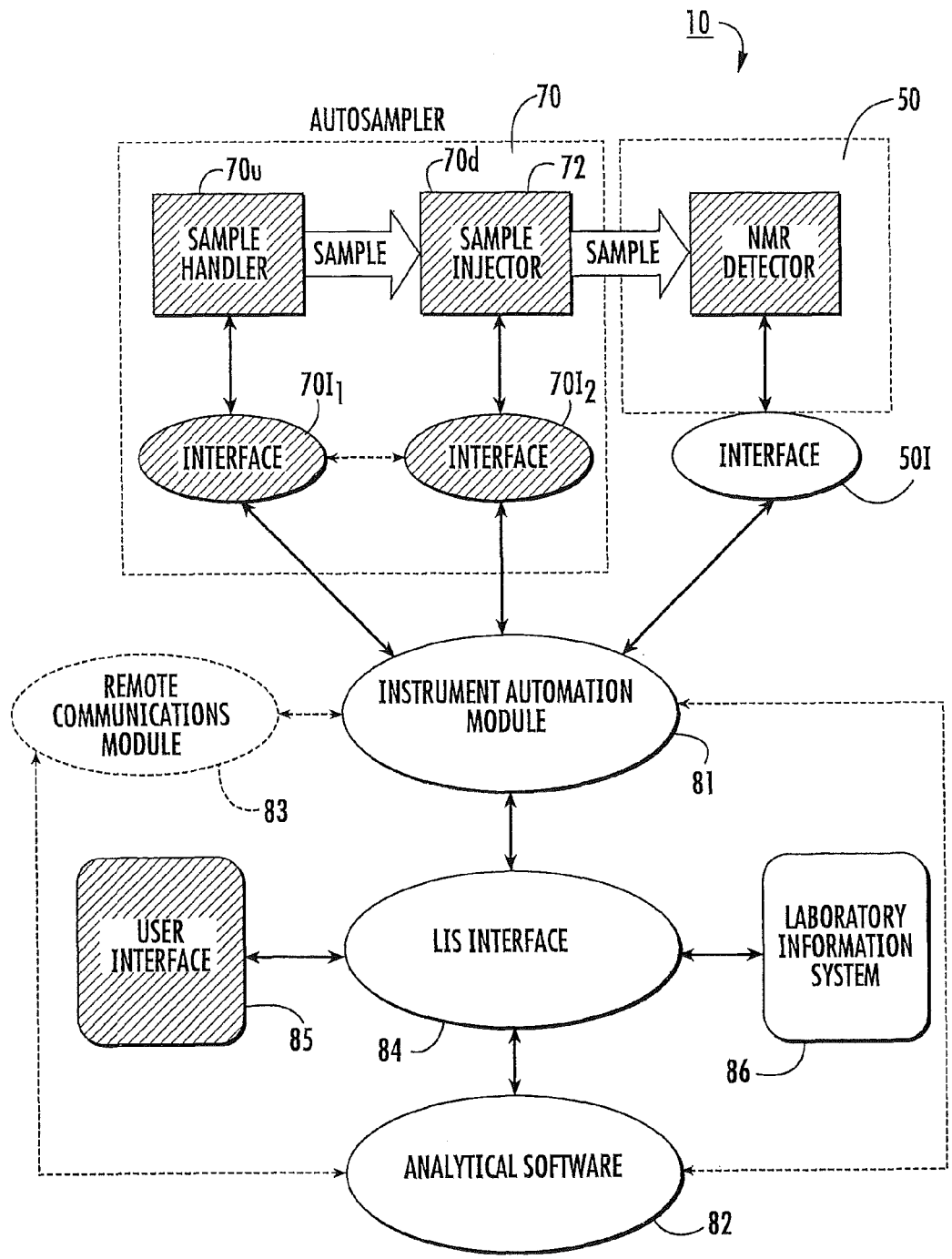
FIG. 6 is a schematic illustration of an automated clinical NMR analyzer according to embodiments of the present invention.

In certain embodiments, as shown in FIG. 6, the automated clinical NMR analyzer 10 can be configured with modular assemblies including: an automated sample handling assembly 70; an NMR spectrometer or detector 50 (with a modular NMR probe 30); and a sample flow path 65 with flow cell 60 having a flow cell probe 30 that resides in the NMR spectrometer magnet bore 20*b*. Each modular assembly component can be configured to releasably operate with its mating modular components thereby allowing ease of repair and/or field replacement. Further, the analyzer 10 is configured with interface software that allows the operational interchange between the different modular assemblies. The flow cell 60 may be considered a part of the NMR detector 50 or the sample handler 70 for modularity purposes. Either way, the NMR analyzer 10 includes suitable interfaces (software and/or hardware) between the automated sample handler 70 and the NMR detector 50 so as to allow the NMR detector module 50 and the sample handler module 70 to cooperate to automatically serially analyze biosamples in a high-volume throughput.

Typically, the NMR analyzer 10 can diagnostically analyze at least about 400, and more typically at least about 600, samples per twenty-four hours. The modular system 10 can be configured so that it can operate in a laboratory environment by staff with little training in NMR support functions. The system 10 may also operate with reduced maintenance and downtime over conventional NMR detectors and can have a simplified user interface.

In certain embodiments, the NMR detector 50 can include a flow probe 30 that can be modularly replaced in the field and calibrated for operation within a relatively short time upon identification of a malfunction or contamination of the probe 30 due to flow cell leaks and the like.

The system 10 can be configured to store certain operating values of the flow probe 30 being removed and those values can be can be pre-calibrated to defined norms for the new or replacement flow probe 30. In particular embodiments, the flow probe 30 can include a memory card or chip that stores certain operational parameter values (input upon installation and/or automatically at desired intervals) and can be used in a replacement flow probe 30. In other embodiments, the capacitors and/or other tunable circuit components can be programmatically tuned by an automated tuning routine carried out by the NMR analyzer 10 and/or control system 15.

The flow probe 30 may be configured so that tuning capacitors are mounted underneath (where the flow probe is inserted from the bottom into the bore) or above (where the flow probe is inserted from the top of the magnet bore) the flow probe for easy external access. The flow probe 30 can be a generally rigid member that is configured to releasably mount to the magnet without the use of permanent (solder-type) connections.

FIG. 6 illustrates one embodiment of a modular analyzer 10. In this embodiment, the sample handler assembly 70 includes an upstream portion 70*u* that provides a staging or queuing sample handler subassembly with automated drive means and a downstream portion 70*d* that includes the sample intake member (such as an injector) 72. Each portion 70*u*, 70*d* can have a respective software interface 70I$_1$, 70I$_2$ that communicates with the instrument automation control module 81. The respective interfaces 70I$_1$, 70I$_2$ may also optionally communicate with each other. The NMR detector 50 also includes a software interface 50I that communicates with the automation control module 81. The instrument automation control module 81 can be configured to interface with a computer interface and/or network connection circuit/board 50B of the NMR detector 50 (FIG. 7), monitor and/or control sensors, detectors, and/or alarms and direct that certain actions and/or functions be carried out when errors or undue process parameter variations are detected, provide remote access to the remote station 15 (FIG. 4), directly and/or via the remote communications module 83, and support automated start-up and automated (daily) process control monitoring.

As shown in FIG. 6, the instrument automation module 81 optionally communicates with the remote communications module 83 a LIS ("Laboratory Information System") interface 84. The LIS interface 84 is in communication with the LIS system 86 and a user interface module 85 that accepts local user input into selection of certain operating features and/or test report parameters. The LIS interface 84 can be a common interface that communicates with other equipment or lab programs, allowing a single common interface that a local user can use in the clinical laboratory. The LIS interface 84 can be in communication with the analytical software module 82 that includes the test quantification analysis or evaluation program code (and may be proprietary and/or customized to each type of analysis performed). The data (raw and/or in report form) can be transmitted to the laboratory's LIS. As indicated by the broken line connections, the analytical software module 82 may optionally communicate directly with either the instrumentation automation module 81 and/or the remote communications module 83.

The term "module" refers to program code that is directed to carrying out and/or directing particular operational, communications and/or monitoring functions. The term "module" is not meant to limit the program code to a bundled package or a successive portion of code, as the module program code may be distributed code within a particular processor or processors that are in communication. As such, the module may be a stand-alone module on a respective single processor or may be configured with an architecture/hierarchy that plugs into other program modules on one or more processors. Furthermore, selected ones or each module noted in the figures may share common code or functionality with other modules.

Figure 7:
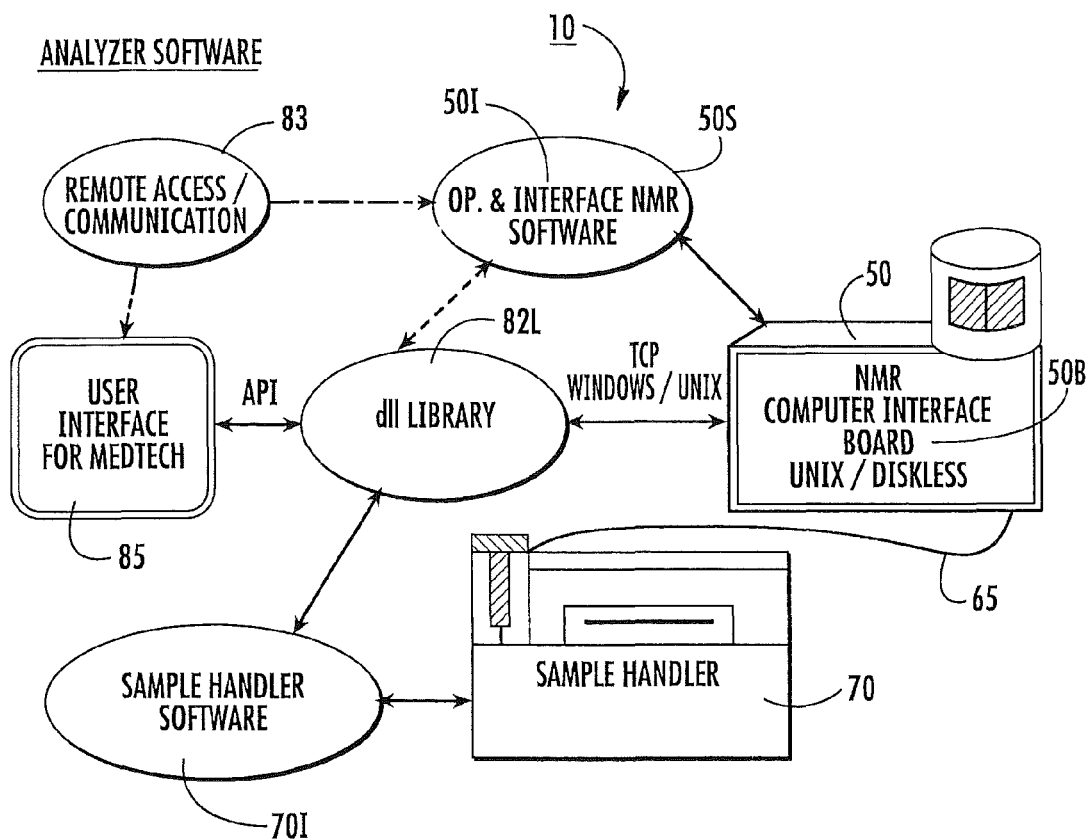
FIG. 7 is a schematic illustration of another embodiment of an automated clinical analyzer according to the present invention.

FIG. 7 illustrates another embodiment of the automated clinical NMR analyzer 10. As shown, the NMR detector 50 includes an NMR operational software module 50S with an interface 501. The NMR software module 50S is in communication with the remote access/communications module 83. The remote access/communications module 83 may also be in communication with the user interface 85. In the embodiment shown, the system 10 includes an electronic library 82L of predetermined computer program functions that stores common parameters, or computer program routines, such as a NMR normalization factor, that can be accessed by a plurality of interface components so that the common routines or values do not have to be separately coded in each device/component. As shown, the sample handler interface 70I, the user interface 85, and the NMR detector 50 can access the common library (shown s "dll") 82L (directly to the NMR detector as shown and/or optionally via the NMR software module 50S).

The normalization factor is used to standardize the measurements of different NMR analyzers. Different NMR probes will have different (typically instrument specific) sensitivities based on the "Q" factor of the probe. Q is defined as the frequency of the resonant circuit divided by the half power bandwidth. A standard sample like, for example, trimethyl acetic acid (TMA) can be run on different NMR machines and with different probes, and the integral of the $CH_3$ proton can be measured to standardize it to a fixed value. The ratio between the predefined (fixed) value and the integral under then-current conditions is termed the "normalization factor", and this can be used to standardize different NMR analyzers by multiplying any raw NMR intensity by the normalization factor. An extension of the same concept allows for adjusting for relatively small sensitivity differences from day to day for the same probe on a particular NMR analyzer by running the same standard sample and calculating the daily normalization factor in a similar manner. Hence, the NMR normalization factor can be calculated in situ for each NMR analyzer for each probe and, in some embodiments, adjusted for each NMR analyzer at desired intervals (such as after certain numbers of samples, upon start-up, upon detection of a change in selected local operational conditions).

Figure 8A:
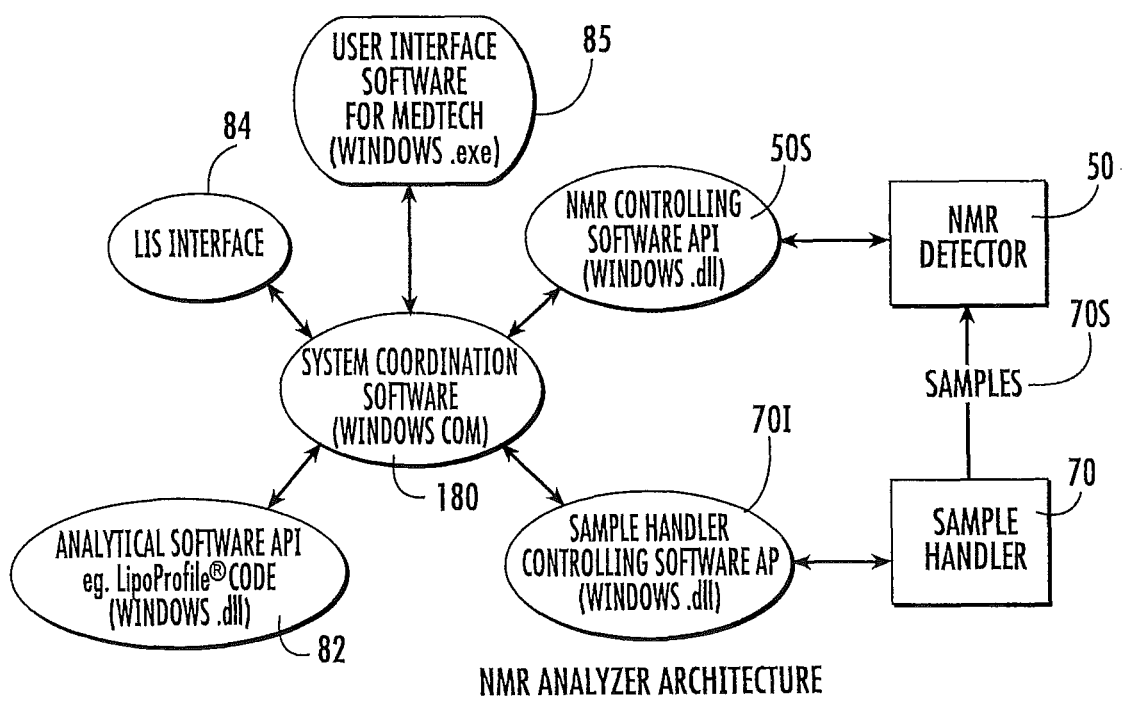
FIG. 8A is a schematic of NMR analyzer software architecture according to embodiments of the present invention.

FIG. 8A illustrates yet another embodiment of an exemplary structure of an NMR analyzer 10. In this embodiment, system coordination software 180 communicates with the analytical software 82, the LIS interface 84, the user interface 85, the NMR control software 50S and the sample handler control/interface software 70I (which can include both the upstream and downstream interfaces $70I_2$, $70I_1$, respectively as shown in FIG. 6). In this embodiment, hardware components are controlled though the interface software. The software can provide functionality by exposing a collection of function calls that implement an Application Programming Interface ("API"). The function calls can include mid- and high-level commands. For example, in the sample handler 70, "aspirate" or "move to safe travel height" are mid-level commands. High-level commands generally include multiple mid-level commands which are encompassed by a high-level command. For example, a high-level command of "inject sample (x)" implies several mid-level commands be carried out to achieve this function, such as a requirement to move to a safe travel height, position over sample (x), move down, and aspirate sample (x). Examples of API commands that may be used for certain NMR detector functions include, but are not limited to the following:

AcquireData ([IN] acquisition parameters, [OUT] fid data) This command provides the parameter set defining the desired NMR experiment. The NMR performs the experiment and returns the acquired data (perhaps an fid) to the calling software.

ApplyPhase ([IN] ft data, [IN] phase, [OUT] ft data)

AutoPhase ([IN] ft data, [OUT] ft data), [OUT] phase)

Calibrate90Pulse ([IN] starting acquisition parameters, [OUT] ending acquisition parameters)

CalibrateTemperatureController( )

CenterField ([OUT] field center position)

ComputeFt ([IN] processing parameters, [IN] fid data, [OUT] ft data)

GradientShim ([IN] shim map, [OUT] shim values)

PhaseLockSignal ([OUT] phase)

SetPhase ([IN] phase)

SetTemperature ([IN] target temperature)

TuneProbe ([IN] channel, [OUT] frequency, [OUT] match value)

TuneTemperatureController( )

Figure 8B:
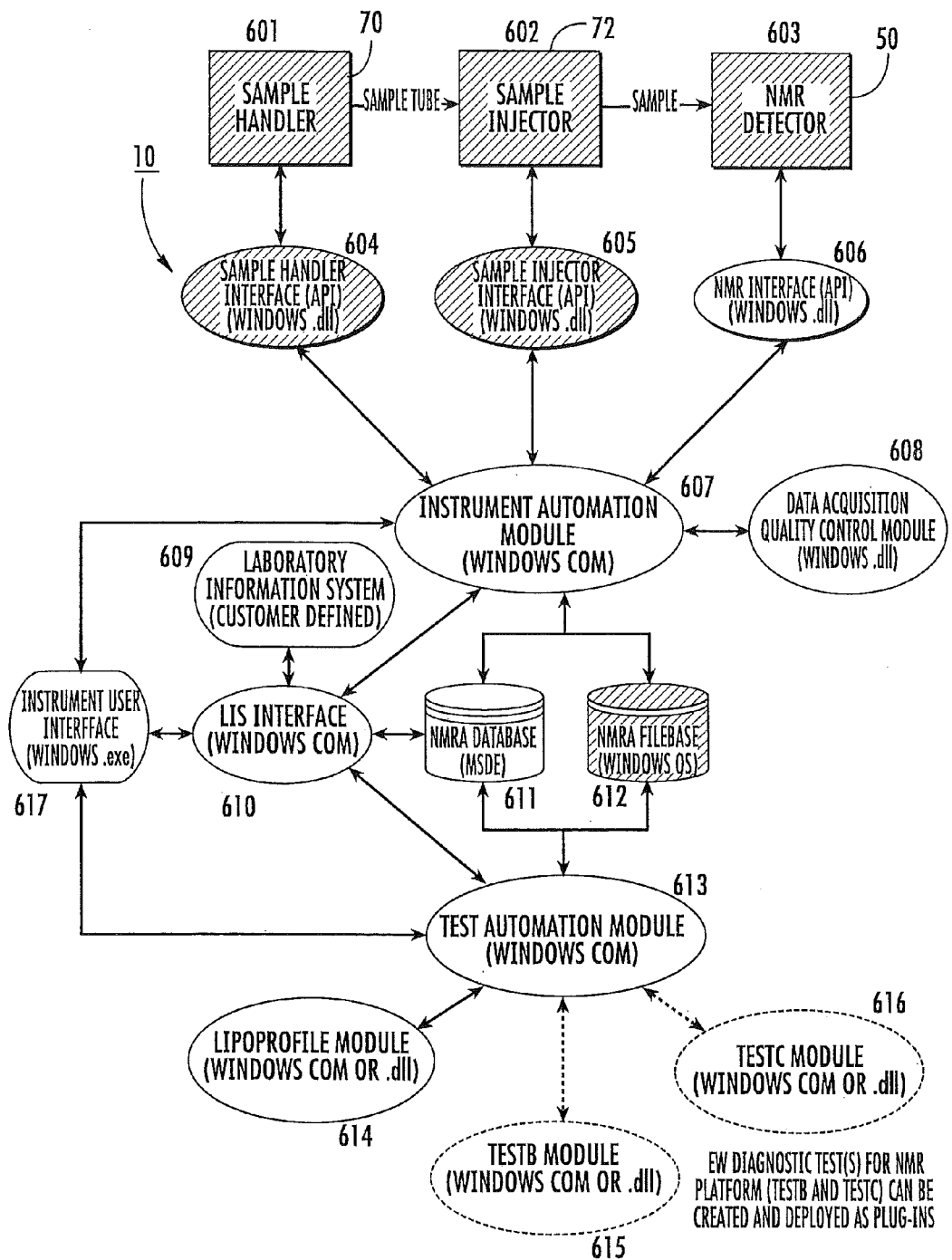
FIG. 8B is a schematic of NMR analyzer software architecture according to embodiments of the present invention.

FIG. 8B is yet another schematic illustration of control and/or communication architecture that can be used for the NMR analyzer 10. As before, an instrument automation module 607 can communicate with the NMR detector 50, the sample handler 70 and the sample intake member 72 (which may in some embodiments be an injector). The sample intake member 72 may share the sample handler interface 604 and/or be controlled through the sample handler 70 in lieu of having its own direct interface 605 with the instrument module 607 as shown. In some embodiments, the sample intake member 72 can be configured to aspirate the sample into a flow path 65 as discussed above. In other embodiments, the sample intake member 72 can be configured to move the sample held in a container into the NMR detector 50. In any event, as shown, the sample handler 70 and the NMR detector 50 each include an interface, 604, 606, respectively.

The instrument automation module 607 can communicate with a data acquisition quality control module 608, a LIS interface 610, an instrument user interface 617, an NMR Analyzer ("NMRA") database 611 and an NMRA filebase 612. The system 10 can also include a test automation module 613 that allows a selection of different diagnostic test options using the NMR platform. TestB and TestC modules, 615, 616, respectively, can be configured as separate modules that can be deployed as plug in modules. The test automation module 613 can communicate with the LIS interface 610 the instrument user interface 617, and at least indirectly, with the instrumentation automation module 607.

Self-Diagnostic/Calibration

Figure 9:
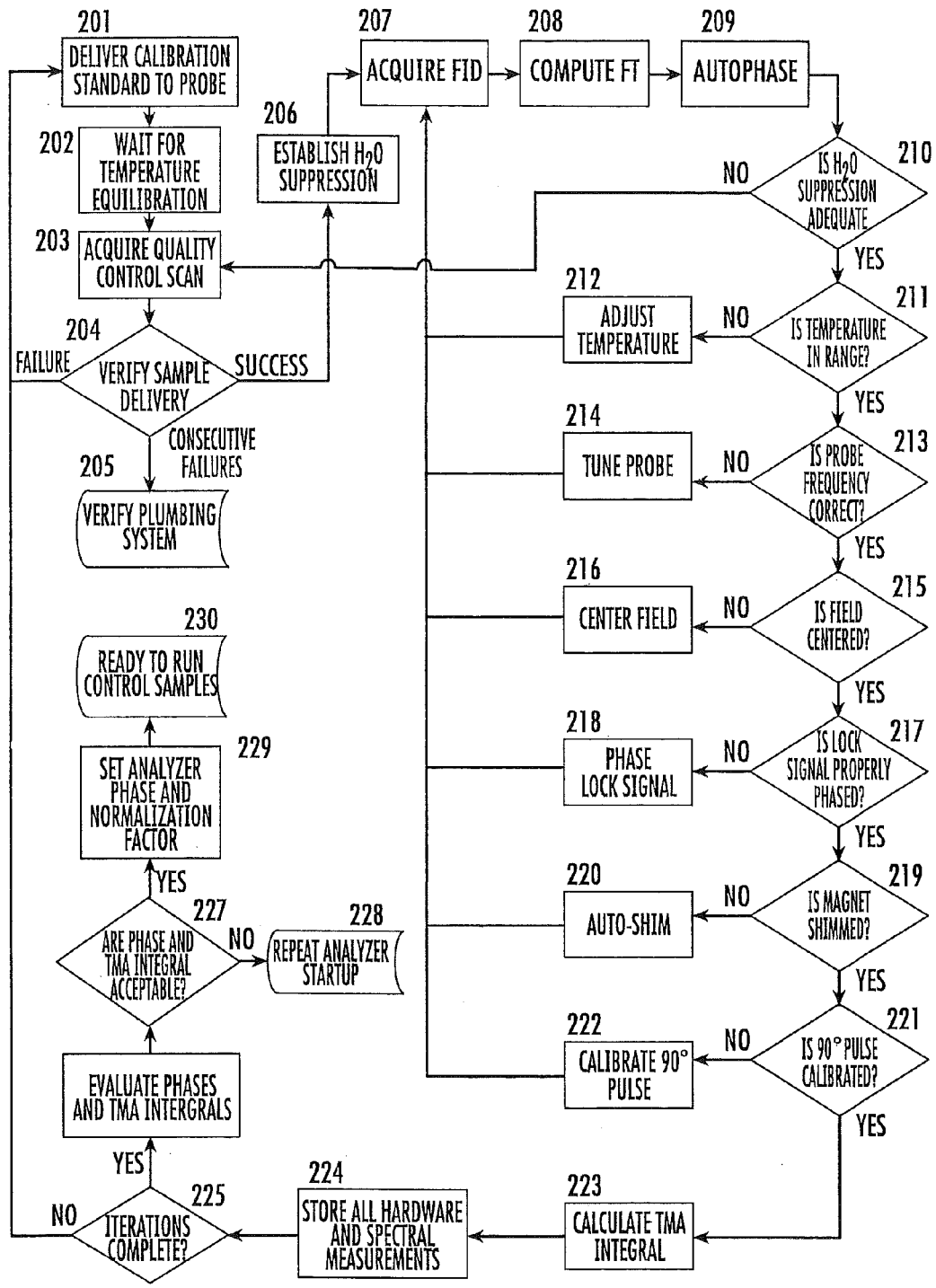
FIG. 9 is a flow chart of operations that can be carried out for an NMR analyzer start-up and/or process evaluation procedure according to embodiments of the present invention.

FIG. 9 is a flow chart of exemplary operations (blocks 201-230) that can be executed as a part of an automated self-diagnostic, calibration, and/or tuning start-up procedure that can help assure that the NMR analyzer 10 is ready for clinical data output before authorizing or allowing evaluation of "real" patient or other target samples. The start-up procedure may be self-executing upon operator sign-in or initiation. The start-up procedure may also be configured to run at desired intervals, after a certain number of samples are throughput, and/or when the process appears to be out of absolute or relative process limits.

Figure 10:
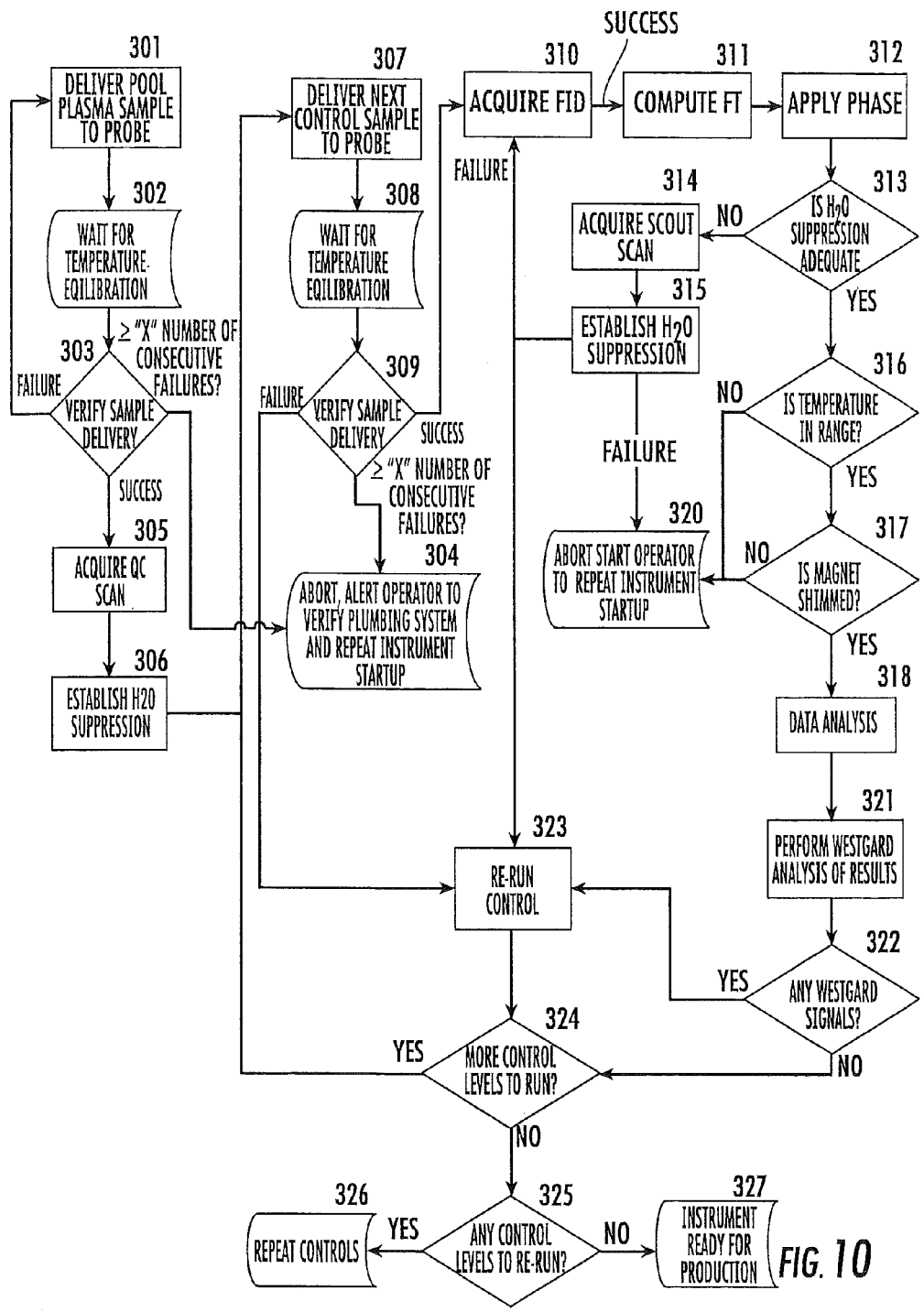
FIG. 10 is a flow chart of operations that can be carried out to run control samples of validated material through an NMR analyzer according to embodiments of the present invention.

FIG. 10 is a flow chart of exemplary operations (blocks 301-327) that can be executed as part of an automated procedure for running quality control samples through the NMR analyzer 10 including detector 50. As before, the operations can be carried out at start-up and/or at other desired intervals. The term "quality control scan" refers to a scan taken of a control reference analyte(s) and/or a biosample to assess operational status/conditions of the analyzer 10 and/or its environment at a desired time to assess the operational status or condition of the analyzer 10 and/or its environment. The reference analyte is configured to generate a reference peak in an NMR signal.

The reference analyte(s) can be provided in a calibration solution of a plurality of different constituent chemicals. In some embodiments, the reference analyte is Trimethylacetic acid ("TMA"). In particular embodiments, the TMA is in a solution comprising KCl, $CaCl_2$, $Na_2EDTA$ and $D_2O$. However, the reference analyte can be any suitable analyte that can generate a reference peak in a NMR signal. In some embodiments, the reference analyte can comprise a molecule that can generate a relatively sharp peak that can be used as a reference for shimming quality and/or to identify the position of other peaks in the NMR spectrum. Typically, the reference analyte is used qualitatively rather than quantitatively, but may also be used quantitatively as appropriate.

Figure 11:
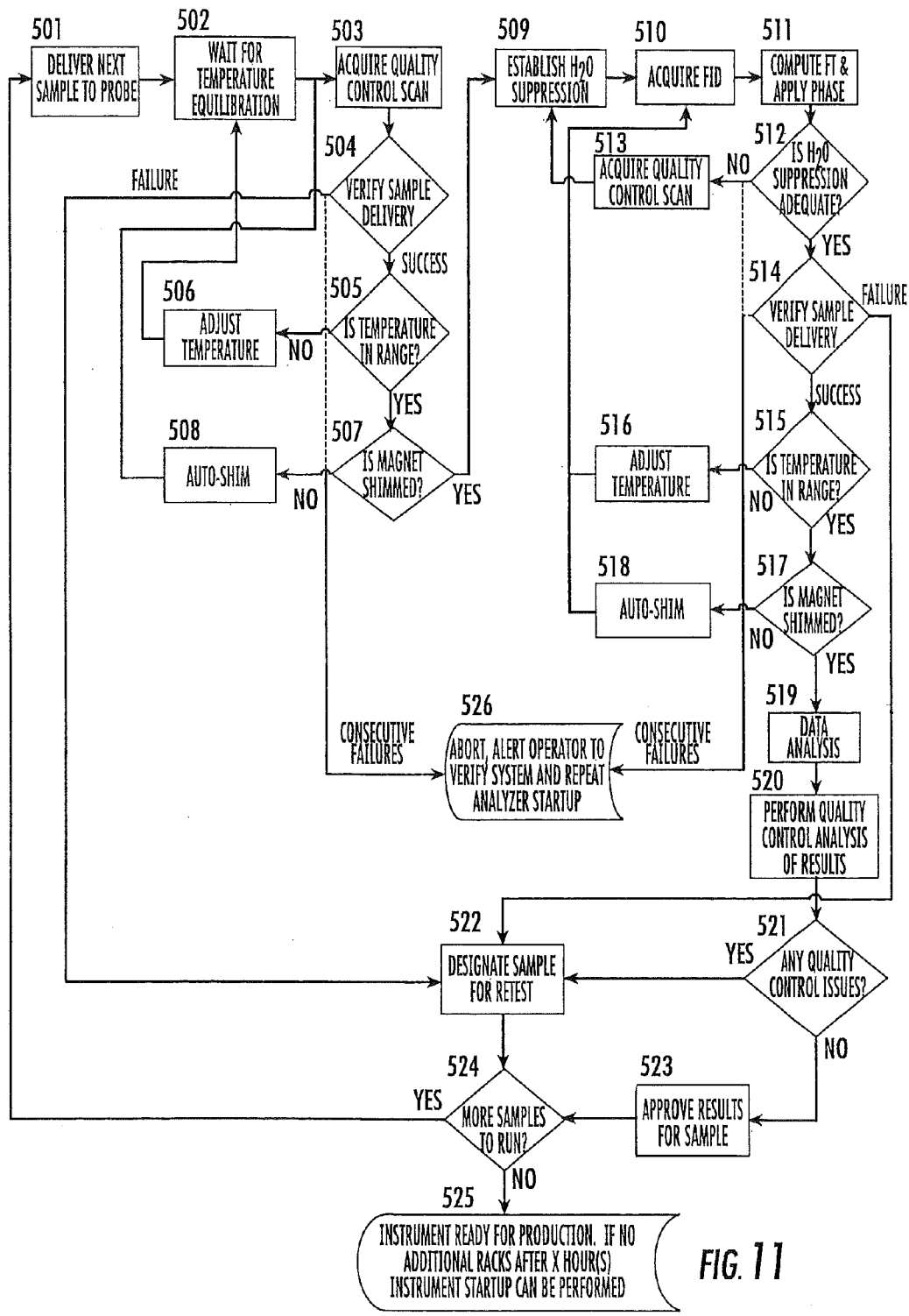
FIG. 11 is a flow chart of normal-run mode or operation of an NMR analyzer according to embodiments of the present invention.

FIG. 11 is a flow chart of exemplary operations (blocks 501-526) that can be executed as part of "normal" operation and/or active-analysis run mode for an automated procedure for running the NMR analyzer 10.

Certain blocks, groups of blocks, and/or combinations of blocks from any or each of FIGS. 9-11 can be used in particular embodiments.

Figure 12:
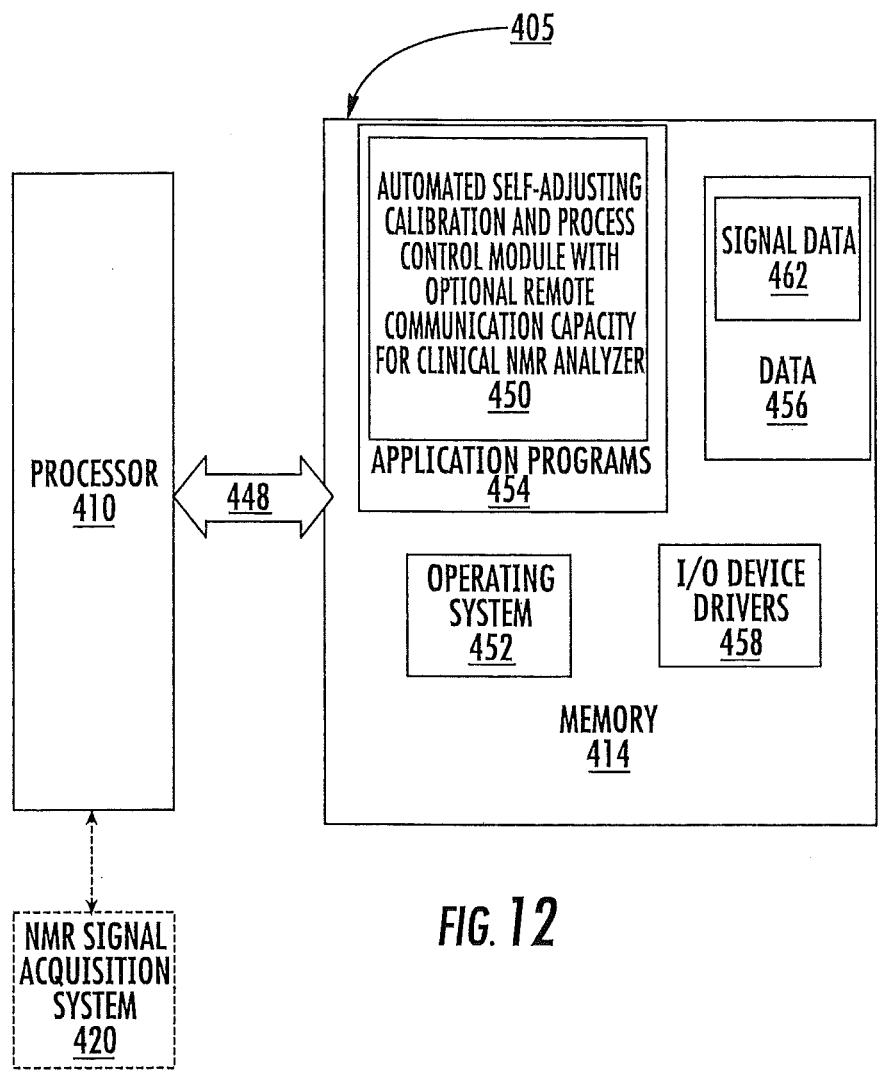
FIG. 12 is a schematic diagram of a data processing system according to embodiments of the present invention.

FIG. 12 is a block diagram of exemplary embodiments of data processing systems that illustrate systems, methods, and computer program products in accordance with embodiments of the invention. The Processor 410 communicates with the memory 414 via an address/data bus 448. The processor 410 can be any commercially available or custom: microprocessor. The memory 414 is representative of the overall hierarchy of memory devices containing the software and data used to implement the functionality of the data processing system 405. The memory 414 can include, but is not limited to, the following types of devices: cache, ROM, PROM, EPROM, EEPROM, flash memory, SRAM, and DRAM.

As shown in FIG. 12, the memory 414 may include several categories of software and data used in the data processing system 405: the operating system 452; the application programs 454; the input/output (I/O) device drivers 458; an automation module 450, which might provide capabilities such as self-adjusting calibration, processing control, or remote communications; and data 456.

The data 456 may include NMR signal (constituent and/or composite spectrum lineshape) data 462 which may be obtained from a data or signal acquisition system 420. The data can include values, other operating or process parameters of interest, such as leak sensors, thermal sensors, pressure sensors, RF power sensors, the number of successive irregular NMR signal scans, service histories, maintenance files, sample history files, and the like. As will be appreciated by those of skill in the art, the operating system 452 may be any operating system suitable for use with a data processing system, such as OS/2, AIX or OS/390 from International Business Machines Corporation in Armonk, N.Y., Windows CE, Windows NT, Windows 95, Windows 98, Windows 2000, or Windows XP from Microsoft Corporation, Redmond, Wash., Palm OS from PalmSource, Inc., Sunnyvale, Calif., Mac OS from Apple Computer, Inc, UNIX, FreeBSD, or Linux, proprietary operating systems or dedicated operating systems, for example, for embedded data processing systems.

The I/O device drivers 458 typically include software routines accessed through the operation system 452 by the application programs 454 to communicate with devices such as I/O data port(s), data storage 456 and certain memory 414 components and/or the data acquisition system 420. The application programs 454 are illustrative of the programs that implement the various features of the data processing system 405 and preferably include at least one application that supports operations according to embodiments of the present invention. Finally, the data 454 represents the static and dynamic data used by the application programs 454, the operating system 452, the I/O device drivers 458, and other software programs that may reside in the memory 414.

While the present invention is illustrative, for example, with reference to the automation module 450 being an application program in FIG. 12, as will be appreciated by those of skill in the art, other configurations may also be utilized while still benefiting from the teachings of the present invention. For example, the automation module 450 may also be incorporated into the operating system 452, the I/O device drivers 458, or other such logical division of the data processing system 405. Thus the present invention should not be construed as limited to the configuration of FIG. 12, which is intended to encompass any configuration capable of carrying out the operations described herein.

In certain embodiments, the automation module 450 may include computer program code for communicating with a remote control system (local or offsite). The automation module 450 can also include program code that provides: automated multi-parameter process monitoring and self-correction/adjustment, a log of operational conditions that may be correlated to patient samples (including time/date data), selectable test formats and selectable test analysis, a log of data variability and/or service history, a log of the number of patient samples processed (which may be parsed over desired intervals), and archived process parameter information for remote interrogation, diagnostics, and other data as indicated above.

In particular embodiments, the NMR analyzer 10 can be configured to electronically monitor (alone and/or cooperating with a remote control system 15) a plurality of components for selected operational variables and to carry out different testing methodologies according to the test desired of a particular biosample to facilitate automated function of the device automatically whereby the NMR analyzer 10 operates without requiring undue amounts of manual input and/or on-site service support during normal operation. Examples of the components and variables were discussed above and are illustrated in the figures and can include, for example, one or more of the following:

electronically monitoring measurements of selected components and adjusting the operational output/input so that the component(s) operate within a desired range;

electronically automatically calibrating selected electronic components;

executing an automated calibration routine at start-up or other desired intervals;

electronically tuning the flow cell probe;

electronically centering a resonance of a sample constituent (which may be a sample solvent) within an RF window of interest (i.e., centering a magnetic field in an acquisition window);

electronically adjusting lock power and lock phase;

electronically shimming the magnet to a desired level of homogeneity;

adjusting the temperature of the flow cell probe;

adjusting the temperature of the biosample;

electronically calibrating the pulse width of the RF excitation pulse used to excite the biosample in the magnet bore;

electronically (programmatically) determining a normalization factor to adjust for instrument-specific sensitivity in situ;

electronically correlating a biosample with a patient identifier in situ (such as at the point of aspiration):

electronically obtaining the NMR clinical test data from the biosample and electronically relating the test data to the patient;

electronically controlling the introduction of a reagent(s) to the biosample prior to obtaining the NMR spectra thereof;

electronically controlling the introduction of a selected calibrant material to the biosample prior to obtaining NMR spectra;

conditioning the biosample to a desired temperature range;

obtaining NMR spectra of the biosample using the appropriate NMR test;

obtaining NMR spectra of the biosample and/or a control validation sample to verify test conditions separate from obtaining NMR spectra of the biosample for clinical diagnostic analysis;

electronically invalidating, not acquiring, flagging or discarding NMR spectra for a biosample when test conditions are outside defined acceptable limits;

electronically verifying whether the biosample is delivered properly to a test location in the magnet bore (such as confirming the biosample is static or whether it constitutes an "infinite sample" whereby the sample extends beyond the detection region so that there are no or reduced boundary effects);

electronically determining whether the delivered biosample has air bubbles as it resides in the NMR probe flow cell;

electronically determining the temperature of the biosample as it resides in the flow cell (and may include automatically adjusting the temperature of the biosample in situ if it is outside acceptable limits);

electronically determining whether the suppression of a water signal is in a desired operational range (and if not electronically adjusting parameters to adjust the water suppression to be within the desired range);

electronically determining what type of diagnostic test to run on the biosample under analysis;

electronically adjusting experiment protocol parameters based on the biosample and/or properties thereof;

electronically obtaining NMR derived measurements of lipoprotein particle size(s) and concentrations in a blood plasma and/or serum sample;

electronically determining a patients risk of having and/or developing CHD and/or Type II diabetes based on NMR derived lipoprotein measurements;

electronically determining an NMR derived diagnostic data measurement of the biosample and generating an electronic patient report of the data;

electronically obtaining NMR spectra to qualitatively determine the presence or absence of a selected species or constituent, subspecies, analyte, interference material, contaminant and/or toxin; and electronically obtaining NMR spectra to quantitatively determine the concentration a selected species or constituent, subspecies, analyte, interference material, contaminant and/or toxin.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses, where used, are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed:

1. A clinical NMR in vitro diagnostic analyzer, comprising:
   an NMR spectroscopy instrument comprising a high-filed magnet with a magnet bore;
   an automated sample handler configured to automatically introduce biosamples into the magnet bore;
   means for automatically obtaining NMR signal spectra of the biosamples;
   means for automatically electronically sensing data associated with selected operating parameters to verify that test conditions of the NMR diagnostic analyzer are within target operating ranges; and
   means for automatically electronically adjusting selected operating parameters based on the verified test conditions.

2. A clinical NMR analyzer according to claim 1, further comprising:

means for automatically quantitatively and/or qualitatively analyzing the NMR signal spectra to obtain measurements of the respective biosamples; and means for generating a patient report summarizing the measurements of the biosamples.

3. A clinical NMR analyzer according to claim 1, further comprising:

means for automatically monitoring NMR signal lineshapes of the obtained NMR signal spectra; and means for automatically scaling the NMR signal spectra of the biosamples responsive to the monitored signal lineshape.

4. A clinical NMR analyzer according to claim 1, wherein the clinical NMR analyzer is configured to run an automated self-diagnostic quality control test at startup.

5. A clinical NMR analyzer according to claim 1, wherein the sample handler is configured to serially flow respective biosamples into an enclosed flow path that extends into the magnet bore, and wherein the analyzer comprises a non-transitory computer readable storage medium with computer program code that is configured to determine a patient's risk of having and/or developing CHD based on the NMR derived quantitative measurements of the patient's respective biosample.

6. A clinical NMR analyzer according to claim 1, wherein the clinical analyzer is configured to determine a patient's risk of having and/or developing Type II diabetes based on the NMR derived quantitative measurements of the patient's respective biosample.

7. A clinical NMR analyzer according to claim 1, wherein the analyzer include at least one processor configured to: (i) obtain NMR spectra of a standard during operation; (ii) perform a spectral deconvolution of a predetermined region of the obtained NMR spectra of the reference control material; and (iii) compare data associated with the spectral deconvolution of the region with data associated with a priori spectra of the standard material to determine whether the NMR analyzer is in a suitable operational status and/or ready for diagnostic testing operation.

8. A clinical NMR analyzer according to claim 1, further comprising a top-loading flow probe that resides in the bore of the magnet to surround respective biosamples.

9. A clinical NMR analyzer according to claim 1, wherein the means for automatically obtaining, the means for automatically electronically sensing, and the means for automatically electronically adjusting include at least one electronic circuit in communication with an externally accessible user interface with at least one processor that carries out the obtaining, sensing and adjusting.

10. A clinical NMR analyzer according to claim 1, further comprising a single housing that encloses the sample handler and the NMR spectrometer and holds an externally accessible graphic user interface.

11. A clinical NMR in vitro diagnostic analyzer, comprising:

an NMR spectroscopy instrument with a high-field superconducting magnet having a magnet bore;

an automated sample handler configured to automatically introduce biosamples into the magnet bore;

a control circuit in electronic communication with the NMR spectroscopy instrument and sample handler; and a plurality of electronic sensors disposed in the clinical NMR analyzer, the electronic sensors in communication with the control circuit, the electronic sensors configured to detect data associated with selected operating parameters to verify that selected conditions of the NMR diagnostic analyzer are within target operating ranges, wherein the control circuit is configured to automatically electronically adjust selected operating parameters and/or generate an alert based on data provided by the electronic sensors.

12. A clinical NMR analyzer according to claim 11, wherein the analyzer control circuit is configured to:

automatically electronically monitor NMR signal lineshapes of obtained NMR signal spectra of target biosamples; and automatically electronically scale the NMR signal spectra of the biosamples responsive to the monitored signal lineshape.

13. A clinical NMR analyzer according to claim 11, wherein the clinical NMR analyzer is configured to run an automated electronic self-diagnostic quality control and/or calibration test at intervals during operation.

14. A clinical NMR analyzer according to claim 11, wherein the clinical NMR analyzer is configured as a single housing unit that encloses the NMR spectrometer and automated sample handler and holds an externally accessible graphic user interface.

15. A clinical NMR analyzer according to claim 11, further comprising a remote control circuit in communication with the clinical NMR analyzer, the remote control circuit and the clinical NMR analyzer configured to electronically communicate during operation whereby data regarding monitored operating parameters is transmitted to the remote control circuit.

16. A clinical NMR analyzer according to claim 15, in combination with a network of clinical NMR analyzers, the network of clinical analyzers being in communication with the remote control circuit, wherein the remote control circuit is configured to monitor selected local operating parameters associated with each clinical NMR analyzer.

17. A clinical NMR analyzer according to claim 11, wherein the control circuit is configured to automatically run a quality control status evaluation of selected operational parameters at intervals during operation.

18. A clinical NMR analyzer according to claim 11, further comprising a top-loading flow probe residing in the magnet bore that is in communication with the control circuit.

19. A clinical NMR analyzer according to claim 11, wherein the control circuit is configured to initiate an automated calibration procedure (i) at start-up as part of a self-diagnostic start-up procedure before authorizing or allowing evaluation of patient samples that are introduced to the flow probe held in the NMR spectrometer and (ii) when one or more of the selected parameters are determined to be outside desired operational ranges.

20. A clinical NMR analyzer according to claim 11, wherein the control circuit is configured to initiate a defined calibration procedure using a calibration standard delivered to a flow probe in the NMR spectrometer, and wherein the control circuit is configured to automatically abort a test, alert an operator of abnormal conditions and/or adjust operational parameters of selected components of the clinical NMR analyzer based on data obtained by the control circuit.

21. A clinical NMR in vitro diagnostic analyzer, comprising:

a housing;

an NMR spectrometer with a magnet having a bore held in the housing;

an automated sample handler held in the housing, the sample handler configured to automatically introduce biosamples into the magnet bore;

a plurality of sensors in the housing in communication with the NMR spectrometer; and a control circuit in communication with the NMR spectrometer and sample handler, the control circuit configured to (i) automatically obtain NMR signal spectra of the biosamples; (ii) automatically electronically monitor data from the sensors associated with selected operating parameters to verify that test conditions of the NMR diagnostic analyzer are within target operating ranges; and (iii) automatically abort a test, alert an operator of abnormal conditions and/or adjust operational parameters of selected components of the clinical NMR analyzer.

22. A clinical NMR analyzer according to claim 21, wherein the control circuit includes at least one processor configured to automatically quantitatively and/or qualitatively analyze NMR signal spectra to obtain measurements of respective biosamples and generate respective patient reports summarizing the measurements of the biosamples.

23. A clinical NMR analyzer according to claim 21, wherein the automated sample handler comprises a sample handler interface and a sample injector interface, wherein the clinical NMR analyzer comprises an instrument automation module that electronically controls operation of the sample handler, the sample injector and the NMR spectrometer.

24. A clinical NMR analyzer according to claim 23, wherein the control circuit is configured to select what clinical quantitative measurement to be carried out for a respective biosample using the instrument automation module and a patient analytical test module, wherein the patient analytical test module includes a plurality of selectable different tests.

25. A clinical NMR analyzer according to claim 23, wherein the instrument automation module comprises an LIS interface.

26. A clinical NMR analyzer according to claim 23, wherein the NMR analyzer is configured to generate a customizable report format, one for each of a plurality of different test sites.

27. A clinical NMR analyzer according to claim 21, wherein the analyzer further comprises a flow cell held in a flow probe inside the magnet bore, wherein the sample handler holds containers of respective biosamples and the analyzer includes an enclosed flow path the directs the biosamples to flow into the flow cell held inside the flow probe in the magnet bore, and wherein the control circuit is configured to electronically direct an aspirating member to blow out an injection port associated with the flow path after injecting a first sample into the flow path before pre-fetching a second sample to maintain liquid-air gaps between neighboring samples in the flow path.

\* \* \* \* \*